US012799386B2

(12) United States Patent
Kim et al.

(10) Patent No.: US 12,799,386 B2
(45) **Date of Patent: *Nov. 17, 2026**

(54) ORGANIC ELECTROLUMINESCENT DEVICE

(71) Applicant: SOLUS ADVANCED MATERIALS CO., LTD., Iksan-si (KR)

(72) Inventors: Tae Hyung Kim, Seongnam-si (KR); HoCheol Park, Suwon-si (KR); Young Bae Kim, Hwaseong-si (KR); Chang Jun Lee, Ansan-si (KR); Eunjung Lee, Seoul (KR); Youngmi Beak, Yongin-si (KR)

(73) Assignee: SOLUS ADVANCED MATERIALS CO., LTD., Iksan-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/589,017

(22) Filed: Jan. 31, 2022

(65) Prior Publication Data

US 2022/0336753 A1 Oct. 20, 2022

Related U.S. Application Data

(63) Continuation of application No. 16/742,060, filed on Jan. 14, 2020, which is a continuation of application (Continued)

(30) Foreign Application Priority Data

Dec. 27, 2013 (KR) ........................ 10-2013-0166103
Nov. 13, 2014 (KR) ........................ 10-2014-0158154

(51) Int. Cl.
*C09K 11/02* (2006.01)
*C09K 11/06* (2006.01)

(Continued)

(52) U.S. Cl.
CPC ............ *C09K 11/025* (2013.01); *C09K 11/06* (2013.01); *H10K 50/00* (2023.02); *H10K 85/342* (2023.02);

(Continued)

(58) Field of Classification Search
CPC ............. H01L 51/0054; H01L 51/0058; H01L 51/0062; H01L 51/0067; H01L 51/0071;

(Continued)

(56) References Cited

U.S. PATENT DOCUMENTS 7,232,619 B2 * 6/2007 Nomura ................. H05B 33/14
252/301.16
9,543,538 B2 1/2017 Kim et al.

(Continued)

FOREIGN PATENT DOCUMENTS

CN 105829314 A 8/2016
CN 104541576 B 3/2017

(Continued)

OTHER PUBLICATIONS

Chinese Patent Office, Communication issued May 17, 2017 by the Chinese Patent Office in Chinese Application No. 201480071035.2.

(Continued)

*Primary Examiner* — Kregg T Brooks
(74) *Attorney, Agent, or Firm* — Sughrue Mion, PLLC

(57) ABSTRACT

The present disclosure provides an organic electroluminescent device including: an anode; a cathode; and one or more organic material layers interposed between the anode and cathode and selected from the group consisting of a hole injection layer, a hole transporting layer, a light emitting layer, an electron transporting layer, and an electron injection layer, and further including a lifetime enhancement layer (LEL) between the light emitting layer and the electron transporting layer.

12 Claims, 1 Drawing Sheet

Related U.S. Application Data

No. 15/107,971, filed as application No. PCT/KR2014/012888 on Dec. 26, 2014, now Pat. No. 10,573,822.

(51) Int. Cl.

| | |
|---|---|
| ***H10K 50/00*** | (2023.01) |
| ***H10K 50/11*** | (2023.01) |
| ***H10K 50/13*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 85/60*** | (2023.01) |
| ***H10K 101/10*** | (2023.01) |
| ***H10K 101/30*** | (2023.01) |
| ***H10K 101/40*** | (2023.01) |

(52) U.S. Cl.

CPC ......... *H10K 85/622* (2023.02); *H10K 85/626* (2023.02); *H10K 85/654* (2023.02); *H10K 85/657* (2023.02); *H10K 85/6572* (2023.02); *C09K 2211/1007* (2013.01); *C09K 2211/1029* (2013.01); *C09K 2211/185* (2013.01); *H10K 50/11* (2023.02); *H10K 50/13* (2023.02); *H10K 50/15* (2023.02); *H10K 50/16* (2023.02); *H10K 50/171* (2023.02); *H10K 50/18* (2023.02); *H10K 50/181* (2023.02); *H10K 2101/10* (2023.02); *H10K 2101/30* (2023.02); *H10K 2101/40* (2023.02)

(58) Field of Classification Search

CPC ... H01L 51/0072; H01L 51/50; H01L 51/504; H01L 51/5004; H01L 51/5016; C09K 11/025; C09K 11/06

See application file for complete search history.

(56) References Cited

U.S. PATENT DOCUMENTS

| | | | | |
|---|---|---|---|---|
| 10,008,675 | B2 | 6/2018 | Kim et al. | |
| 10,573,822 | B2 * | 2/2020 | Kim | H01L 51/0058 |
| 2002/0182441 | A1 * | 12/2002 | Lamansky | C07F 15/0033 428/917 |
| 2005/0181232 | A1 * | 8/2005 | Ricks | H10K 85/615 428/917 |
| 2006/0251923 | A1 | 11/2006 | Lin et al. | |
| 2006/0263631 | A1 | 11/2006 | Lee et al. | |
| 2006/0280965 | A1 * | 12/2006 | Kwong | H10K 85/624 585/27 |
| 2008/0113216 | A1 * | 5/2008 | Inoue | H05B 33/14 428/690 |
| 2008/0265210 | A1 * | 10/2008 | Kathirgamanathan | C09K 11/06 252/301.16 |
| 2008/0315753 | A1 | 12/2008 | Liao et al. | |
| 2009/0167162 | A1 * | 7/2009 | Lin | C07F 5/027 548/440 |
| 2010/0044689 | A1 | 2/2010 | Nishimura et al. | |
| 2013/0087773 | A1 | 4/2013 | Suzuki et al. | |
| 2014/0374724 | A1 | 12/2014 | Kim et al. | |
| 2015/0200373 | A1 | 7/2015 | Cho et al. | |
| 2015/0207093 | A1 | 7/2015 | Kim et al. | |
| 2015/0340618 | A1 | 11/2015 | Lee et al. | |
| 2015/0364694 | A1 | 12/2015 | Lee et al. | |
| 2016/0351825 | A1 | 12/2016 | Kim et al. | |

FOREIGN PATENT DOCUMENTS

| | | | |
|---|---|---|---|
| JP | 2010-514182 | A | 4/2010 |
| JP | 2016-526029 | A | 9/2016 |
| JP | 2016-526031 | A | 9/2016 |
| KR | 10-2006-0040830 | A | 5/2006 |
| KR | 10-2013-0039298 | A | 4/2013 |
| KR | 20140119642 | | 10/2014 |
| WO | 2006/115232 | A1 | 11/2006 |
| WO | 2008/074847 | A1 | 6/2008 |
| WO | 2010/137733 | A1 | 12/2010 |
| WO | 2011/086941 | A1 | 7/2011 |
| WO | 2013085339 | A2 | 6/2013 |
| WO | 2014/185598 | A1 | 11/2014 |
| WO | 2014185589 | A1 | 11/2014 |
| WO | 2014185595 | A1 | 11/2014 |
| WO | 2015133807 | A1 | 9/2015 |
| WO | 2015190718 | A1 | 12/2015 |
| WO | 2016064102 | A1 | 4/2016 |

OTHER PUBLICATIONS

Japan Patent Office Communication dated Jan. 8, 2019 issued in JP Application No. 2016-543059.

International Searching Authority International Search Report for PCT/KR2014/012888 dated Apr. 15, 2015.

Korean Patent Office, Communication issued Dec. 20, 2017 in KR Application No. 10-2014-0158154.

Partial machine translation of KR-20140119642-A.

Ebenhoch et al., Charge carrier mobility of the organic photovoltaic materials PTB7 and PC71BM and its influence on device performance, Organic Electronics 22, 62-68 (2015).

Partial machine translation of WO-2016064102-A1.

Partial machine translation of WO-2015190718-A1.

Partial machine translation of WO-2015133807-A1.

* cited by examiner

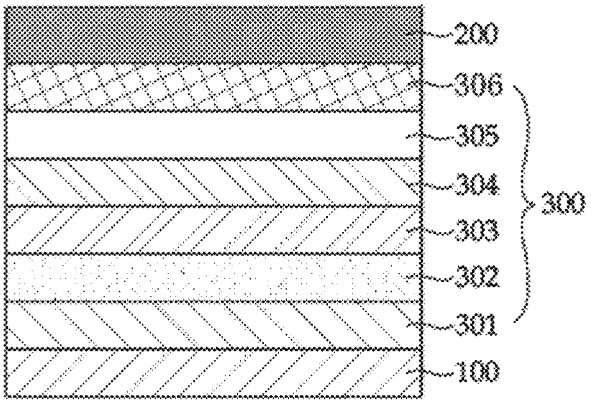
200
306
305
304
303
302
301
100
300

ORGANIC ELECTROLUMINESCENT DEVICE

CROSS REFERENCE TO RELATED APPLICATIONS

This application is a Continuation of U.S. application Ser. No. 16/742,060 filed Jan. 14, 2020, which is a Continuation of U.S. application Ser. No. 15/107,971 filed Jun. 24, 2016, now U.S. Pat. No. 10,573,822, which is a National Stage of International Application No. PCT/KR2014/012888 filed Dec. 26, 2014, claiming priority based on Korean Patent Application Nos. 10-2013-0166103 filed Dec. 27, 2013 and 10-2014-0158154 filed Nov. 13, 2014, the contents of all of which are incorporated herein by reference in their entirety.

TECHNICAL FIELD

The present disclosure relates to an organic electroluminescent device including one or more organic material layers.

BACKGROUND ART

Studies on an organic electroluminescent (EL) device have continued to blue electric light emission using an anthracene single crystal in 1965, and then an organic electroluminescent device having a two-layer laminated structure, which is composed of a hole layer (NPB) and a light emitting layer ($Alq_3$), was proposed by Tang in 1987. Since then, the organic electroluminescent device has been proposed in the form of a multilayer-laminated structure which imparts each characteristic and subdivided function, such as an organic layer which is responsible for injecting and transporting holes, an organic layer which is responsible for injecting and transporting electrons, and an organic layer which induces electroluminescence to occur due to the combination of holes and electrons in the device in order to implement high efficiency and long lifetime characteristics required for commercialization. The introduction of a multilayer-laminated structure improved the performance of the organic electroluminescent device to the level of commercialization characteristics, thereby expanding the application range of the multilayer-laminated structure from the start of a radio display product for a vehicle in 1997 to a mobile information display device and a display device for TV.

The demand for enlargement and high resolution of a display imposes challenges of high efficiency and long lifetime on an organic electroluminescent device. In particular, the high resolution implemented by forming a larger number of pixels in the same area incurs a result of decreasing the light emitting area of the organic electroluminescent pixel, thereby reducing the lifetime, which has become the most important technical challenge which the organic electroluminescent device needs to overcome.

In the organic electroluminescent device, when current or voltage is applied to two electrodes, holes are injected into an organic material layer at the anode, and electrons are injected into an organic material layer at the cathode. When the injected holes and electrons meet each other, an exciton is formed, and the exciton falls down to a bottom state to emit light. In this case, the organic electroluminescent device may be classified into a fluorescent electroluminescent device in which singlet excitons contribute to light emission and a phosphorescent electroluminescent device in which triplet excitons contribute to light emission according to the type of electron spin of the excitons formed.

In the electron spins of the excitons formed by recombining electrons and holes, the singlet exciton and the triplet exciton are produced at a ratio of 25% and 75%. In the fluorescent electroluminescent device in which light is emitted by singlet excitons, it is impossible for the internal quantum efficiency to theoretically exceed 25% according to the production ratio, and the external quantum efficiency of 5% is accepted as the limitation. In the phosphorescent electroluminescent device in which light is emitted by triplet excitons, when a metal complex compound including a transition metal heavy atom such as Jr and Pt is used as a phosphorescent dopant, the light emitting efficiency may be improved up to 4 times compared to the fluorescent electroluminescent device.

As described above, the phosphorescent electroluminescent device exhibits higher efficiency in terms of light emitting efficiency than the fluorescent electroluminescent device based on theoretical facts, but in a blue phosphorescent device except for green and red phosphorescent devices, the development level for the color purity of the deep blue color, a phosphorescent dopant with high efficiency, and a host with a wide energy gap, which satisfies the requirements, is so minimal that the blue phosphorescent device has not been commercialized up to now, and a blue fluorescent device is used for products.

In order to improve characteristics of the organic electroluminescent device, study results for enhancing stability of the device by preventing holes from diffusing into an electron transferring layer have been reported. There has been proposed a technology in which a material such as BCP or BPhen is used between a light emitting layer and an electron transferring layer to prevent holes from diffusing into the electron transferring layer, and a probability of recombining holes and electrons is effectively increased by limiting the diffusion into the inside of the light emitting layer. However, in derivatives such as BCP or BPhen, oxidation stability for holes deteriorates and durability for heat is weak, and accordingly, the lifetime of the organic electroluminescent device is decreased, and the commercialization is not achieved. Further, these materials simply serve to block holes and thus inhibit electrons from moving, thereby increasing the driving voltage of the organic electroluminescent device.

DISCLOSURE

Technical Problem

The present disclosure has been made in an effort to solve the aforementioned problems, and an object thereof is to provide an organic electroluminescent device having high efficiency, a low voltage, and a long lifetime.

Technical Solution

The present disclosure provides an organic electroluminescent device including: an anode; a cathode; and one or more organic material layers interposed between the anode and the cathode and selected from the group consisting of an electron injection layer, an electron transporting layer, a light emitting layer, an electron transporting layer, and an electron injection layer, and further including a lifetime enhancement layer (LEL) between the light emitting layer and the electron transporting layer.

Here, the lifetime enhancement layer (LEL) includes a bipolar compound having both an electron withdrawal group (EWG) with a high electron absorption property and an electron donor group (EDG) with a high electron donor property, in which the bipolar compound satisfies all of the following (a) to (d) conditions.

(a) an ionization potential [Ip(LEL)] is 5.5 eV or more, (b) $E_{HOMO}-E_{LUMO}>2.9$ eV, (c) triplet energy is 2.3 eV or more, and (d) ΔEst<0.5 eV (ΔEst indicates a difference between singlet energy and triplet energy of the compound)

BRIEF OF DRAWINGS

FIG. 1 is a cross-sectional view illustrating an organic electroluminescent device according to an exemplary embodiment of the present disclosure.

DESCRIPTION OF MAIN REFERENCE NUMERALS OF DRAWINGS

100: Anode
200: Cathode
301: Hole injection layer
302: Hole transporting layer
303: Light emitting layer
304: Lifetime enhancement layer
305: Electron transporting layer
306: Electron injection layer

BEST MODE

Hereinafter, the present disclosure will be described.

The present disclosure relates to an organic electroluminescent device including: an anode; a cathode; and an organic material layer interposed between the anode and the cathode, in which the organic material layer includes one or more selected from the group consisting of a hole injection layer, a hole transporting layer, a light emitting layer, a lifetime enhancement layer, an electron transporting layer, and an electron injection layer, and the lifetime enhancement layer (LEL) includes a bipolar compound having both an electron withdrawal group (EWG) with a high electron absorption property and an electron donor group (EDG) with a high electron donor property.

Here, the bipolar compound may be used as a material for not only a lifetime enhancement layer, but also an electron transporting layer, an electron injection layer, or all these layers.

Hereinafter, the present disclosure will be described as follows with reference to FIG. 1.

In the organic electroluminescent device according to the present disclosure, an anode 100 serves to inject holes into an organic material layer 300.

A material which constitutes the anode 100 is not particularly limited, and materials typically known in the art may be used. Non-limiting examples thereof include: a metal, such as vanadium, chromium, copper, zinc, and gold; alloys thereof; a metal oxide, such as zinc oxide, indium oxide, indium tin oxide (ITO), and indium zinc oxide (IZO); a combination of metal and oxide, such as ZnO:Al or $SnO_2$:Sb; a conductive polymer, such as polythiophene, poly(3-methylthiophene), poly[3,4-(ethylene-1,2-dioxy)thiophene] (PEDT), polypyrrole, and polyaniline; carbon black, and the like.

A method for preparing the anode 100 is also not particularly limited, and the anode 100 may be prepared by methods typically known in the art. Examples thereof include a method for coating an anode material on a substrate composed of a silicon wafer, quartz, a glass plate, a metal plate, or a plastic film.

In the organic electroluminescent device according to the present disclosure, a cathode 200 serves to inject electrons into the organic material layer 300.

A material which constitutes the cathode 200 is not particularly limited, and materials typically known in the art may be used. Non-limiting examples thereof include: a metal, such as magnesium, calcium, sodium, potassium, titanium, indium, yttrium, lithium, gadolinium, aluminum, silver, tin, and lead; alloys thereof; and a multilayer structured material such as LiF/Al and $LiO_2$/Al.

Further, a method for preparing the cathode 200 is also not particularly limited, and the cathode 200 may be prepared by methods typically known in the art.

As the organic material layer 300 included in the organic electroluminescent device according to the present disclosure, those used as an organic material layer of the existing organic electroluminescent device may be used without limitation, and examples thereof include one or more selected from the group consisting of a hole injection layer 301, a hole transporting layer 302, a light emitting layer 303, a lifetime enhancement layer 304, an electron transporting layer 305, and an electron injection layer 306. In this case, in consideration of characteristics of the organic electroluminescent device, it is preferred to include all of the above-described organic material layers.

The hole injection layer 301 and the hole transporting layer 302, which are included in the organic material layer 300 of the present disclosure, serve to transport holes injected from the anode 100 to the light emitting layer 303. A material which constitute the hole injection layer 301 and the hole transporting layer 302 is not particularly limited as long as the material has a low hole injection barrier and a high hole mobility, and a hole injection layer/transporting layer material used in the art may be used without limitation. Non-limiting examples thereof include an arylamine derivative.

Further, the light emitting layer 303 included in the organic material layer 300 of the present disclosure is a layer in which holes and electrons meet each other to form an exciton, and the color of light which the organic electroluminescent device emits may vary according to the material constituting the light emitting layer 303. The light emitting layer 303 may include a host and a dopant, and it is preferred that the host is included in a range of 70 to 99.9 wt %, and the dopant is included in a range of 0.1 to 30 wt %.

More specifically, in the case of a blue fluorescence, a green fluorescence, or a red fluorescence, the light emitting layer 303 may include the host in a range of 80 to 99.9 wt %, and may include the dopant in a range of 0.1 to 20 wt %. In addition, in the case of a blue fluorescence, a green fluorescence, or a red phosphorescence, the light emitting layer 303 may include the host in a range of 70 to 99 wt %, and may include the dopant in a range of 1 to 30 wt %.

The host included in the light emitting layer 303 is not particularly limited as long as the host is publicly known in the art, and non-limiting examples thereof include: an alkali metal complex compound; an alkali earth metal complex compound; or a fused aromatic ring derivative, and the like.

More specifically, as the host material, it is preferred to use an aluminum complex compound, a beryllium complex compound, an anthracene derivative, a pyrene derivative, a triphenylene derivative, a carbazole derivative, a dibenzofuran derivative, a dibenzothiophene derivative, or a combination of one or more thereof, which may enhance the light emitting efficiency and lifetime of the organic electroluminescent device.

Furthermore, the dopant included in the light emitting layer 303 is not particularly limited as long as the dopant is publicly known in the art, and non-limiting examples thereof include an anthracene derivative, a pyrene derivative, an arylamine derivative, a metal complex compound including iridium (Ir) or platinum (Pt), and the like.

The light emitting layer 303 may be a single layer or may be composed of a plurality of two or more layers. Here, when the light emitting layer 303 is composed of a plurality of layers, the organic electroluminescent device may emit light with various colors. Specifically, the present disclosure may provide an organic electroluminescent device which includes a light emitting layer composed of a plurality of homogeneous materials between the hole transporting layer 302 and the lifetime enhancement layer 304, or includes a light emitting layer composed of heterogeneous materials in series to display a mixed color. Further, when the device includes a plurality of light emitting layers, the driving voltage of the device is increased, whereas the current value in the organic electroluminescent device becomes constant, so that it is possible to provide an organic electroluminescent device in which the light emitting efficiency is improved with the number of light emitting layers The lifetime enhancement layer 304 included in the organic material layer 300 according to the present disclosure is for improving the lifetime of the organic electroluminescent device, and is included between the light emitting layer 303 and the electron transporting layer 305.

A material, which constitutes the lifetime enhancement layer 304, is not particularly limited, but is preferably a bipolar compound having both an electron withdrawal group (EWG) with a high electron absorption property and an electron donor group (EDG) with a high electron donor property.

More specifically, the bipolar compound has an ionization potential of 5.5 eV or more, and may have an ionization potential of specifically in a range of 5.5 to 7.0 eV, and preferably in a range of 5.5 to 6.5 eV.

In addition, the difference ($E_{HOMO}$−$E_{LUMO}$) between a HOMO value and a LUMO value of the bipolar compound exceeds 2.9 eV, and may be specifically in a range of more than 2.9 eV and 3.5 eV or less.

In this case, the triplet energy is 2.3 eV or more, may be specifically in a range of 2.3 to 3.5 eV, and is preferably in a range of 2.3 to 3.0 eV. Furthermore, the difference between singlet energy and triplet energy of the bipolar compound is less than 0.5 eV, and specifically in a range of less than 0.5 eV and 0.01 eV or more.

That is, holes move with the ionization potential level in the organic electroluminescent device, and when holes pass through the light emitting layer 303 to diffuse or move into the electron transporting layer 305, an irreversible decomposition reaction occurs due to oxidation, thereby leading to a decrease in lifetime of the organic electroluminescent device.

In contrast, since the present disclosure includes the lifetime enhancement layer 304 composed of a bipolar compound having an ionization potential [Ip(LEL)] of 5.5 eV or more to prevent holes from diffusing or moving into the electron transporting layer 305, the lifetime of the organic electroluminescent device may be enhanced. That is, holes are blocked by the high energy barrier of the lifetime enhancement layer 304 and do not diffuse or move into the electron transporting layer 305 and remain in the light emitting layer 303.

Here, when the light emitting layer 303 is composed of a red phosphorescent material, the bipolar compound included in the lifetime enhancement layer 304 may have an ionization potential of 5.5 eV or more, but when the light emitting layer 303 is composed of a green phosphorescent material or a blue phosphorescent material, the bipolar compound has an ionization potential of preferably 6.0 eV or more.

Meanwhile, in the bipolar compound, since the difference ($E_{HOMO}$−$E_{LUMO}$) between HOMO value and LUMO value exceeds 2.9 eV, the triplet energy is 2.3 eV or more, and the difference (ΔEst) between singlet energy and triplet energy is less than 0.5 eV, the use of the bipolar compound for the lifetime enhancement layer 304 may prevent excitons formed in the light emitting layer 303 from diffusing into the electron transporting layer 305, and may also suppress a phenomenon in which light is emitted at the interface of the light emitting layer 303 and the electron transporting layer 305. As a result, this prevents the spectrum mixed color of the organic electroluminescent device, and improves the stability, thereby improving the lifetime of the organic electroluminescent device.

More specifically, the bipolar compound has both an electron withdrawal group (EWG) with a high electron absorption property and an electron donor group (EDG) with a high electron donor property, and thus has characteristics in which the electron clouds of HOMO and LUMO are separated. For this reason, the difference (ΔEst) between triplet energy and singlet energy of the compound is minimal, and thus, the compound satisfies the relationship of $\Delta Est<0.5$ eV, and as a result, the compound may have high triplet energy (T1) even though the difference ($E_{HOMO}$−$E_{LUMO}$) between the HOMO value and the LUMO value exceeds 2.9 eV.

Here, when the light emitting layer 303 is composed of a red phosphorescent material, the bipolar compound included in the lifetime enhancement layer 304 may have an triplet energy of 2.3 eV or more, but when the light emitting layer 303 is composed of a green phosphorescent material, the bipolar compound has triplet energy of preferably 2.5 eV or more, or when the light emitting layer 303 is composed of a blue phosphorescent material, the bipolar compound has triplet energy of preferably 2.7 eV or more.

Meanwhile, when electrons and holes are unbalanced due to the difference between the number of holes injected from the anode 100 and the number of electrons injected from the cathode 200, electrons or holes, which fail to form an exciton due to recombination, are accumulated in the light emitting layer 303. The electrons or holes accumulated in the light emitting layer 303 prevent oxidation and reduction from smoothly occurring in the light emitting layer 303, or affect the adjacent layers, thereby reducing the lifetime of the organic electroluminescent device.

In contrast, as the hole mobility and the electron mobility of the bipolar compound are $1\times10^{-6}$ $cm^2/V\cdot s$ or more at normal temperature, when the bipolar compound is used for the lifetime enhancement layer 304, the lifetime of the organic electroluminescent device may be improved by preventing the injection of electrons from being delayed compared to the number of holes injected from the anode 100.

In practice, the bipolar compound included in the lifetime enhancement layer 304 of the present disclosure exhibits the hole mobility of $1\times10^{-6}$ $cm^2/V\cdot s$ or more at normal temperature due to the electron donor group (EDG), and the electron mobility of $1\times10^{-6}$ $cm^2/V\cdot s$ or more at normal temperature due to the electron withdrawal group (EWG). Accordingly, when the bipolar compound is used for the lifetime enhancement layer 304, electrons may be effectively injected into the light emitting layer 303. When electrons are smoothly injected into the light emitting layer 303 as described above, the efficiency of forming the exciton in the light emitting layer 303 may be improved, thereby enhancing the lifetime of the organic electroluminescent device.

The bipolar compound included in the lifetime enhancement layer 304 of the present disclosure is formed by combining a moiety having an electron withdrawal group (EWG) characteristic with a high electron absorption property with a moiety having an electron donor group (EDG) characteristic with a high electron donor property. In this case, the bipolar compound is characterized by including one or more electron withdrawal group (EWG) moieties represented by the following Chemical Formula as the electron withdrawal group (EWG).

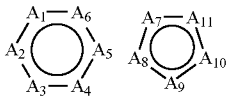

In the formulae, $A_1$ to $A_{11}$ are the same as or different from each other, and are each independently N or C(R), at least one thereof is N, and in this case, a plurality of R's is the same as or different from each other even though being equally indicated, and these groups may form a fused ring with an adjacent group. For example, in the case of a plurality of C(R)'s, $A_1$ and $A_2$, $A_2$ and $A_3$, $A_3$ and $A_4$, $A_4$ and $A_5$, $A_5$ and $A_6$, or $A_6$ and $A_1$ may combine with each other to form a fused ring, and $A_7$ and $A_8$, $A_8$ and $A_9$, $A_9$ and $A_{10}$, $A_{10}$ and $A_{11}$, and $A_{11}$ and $A_7$ may combine with each other to form a fused ring.

R is selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group, the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkyl boron group, the aryl boron group, the phosphine group, the phosphine oxide group, and the arylamine group of R are each independently unsubstituted or substituted with one or more selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group, and the electron withdrawal group (EWG) moiety is a nitrogen-containing heteroaromatic hydrocarbon having 5 or 6 nuclear atoms, in which 1 to 3 carbons are substituted with nitrogen. Further, the electron withdrawal group moiety may be in a form in which two or more rings are simply pendant to or fused with each other, or in a form in which two or more rings are fused with an aryl group.

In the present disclosure, the electron withdrawal group (EWG) moiety may be more embodied as a structure represented by the following chemical formulae, and is preferably a 6-membered nitrogen-containing heteroaromatic hydrocarbon including 1 to 3 nitrogen atoms. Preferred non-limiting examples of the electron withdrawal group (EWG) moiety include pyridine, pyrimidine, triazine, pyrazine, and the like.

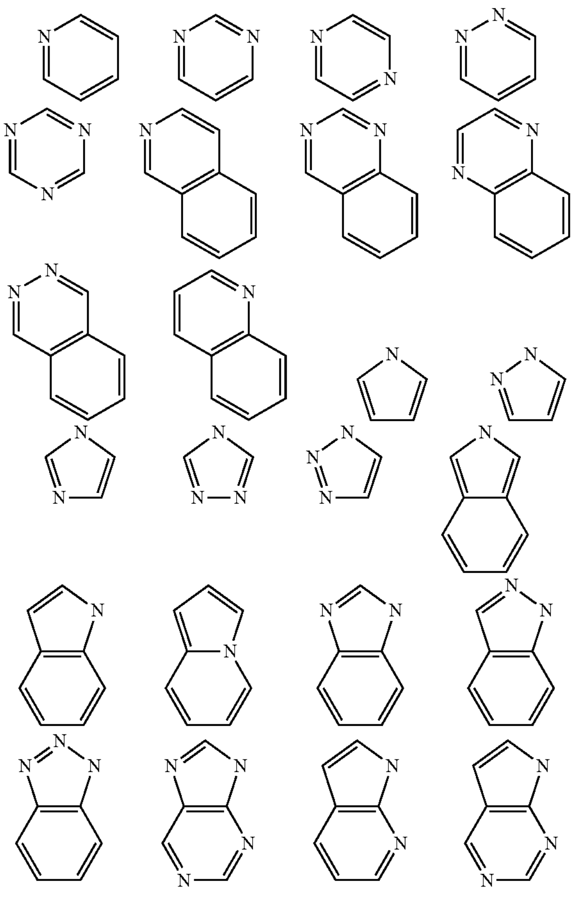

In the present disclosure, the carbon or nitrogen atom of the moiety having an electron withdrawal group (EWG) characteristic with a high electron absorption property forms a bond with the moiety having an electron donor group (EDG) characteristic with a high electron donor property.

The bipolar compound included in the lifetime enhancement layer 304 of the present disclosure is characterized by including an electron donor group (EDG) moiety represented by the following Chemical Formula 1.

As a non-limiting example of the moiety having an electron donor group (EDG) characteristic with a high electron donor property as described above, it is possible to use a fused nitrogen-containing heteroaromatic ring such as indole, carbazole, and azepine; or a fused polycyclic aromatic ring such as biphenyl, triphenylene, and fluorancene, and more specifically, the moiety may be represented by the following Chemical Formula 1.

[Chemical Formula 1]

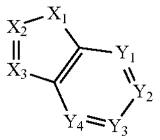

In Chemical Formula 1, $X_1$ is selected from the group consisting of O, S, Se, $N(Ar_1)$, $C(Ar_2)(Ar_3)$, and $Si(Ar_4)(Ar_5)$, $Y_1$ to $Y_4$ are the same as or different from each other, and are each independently N or $C(R_1)$, and in this case, a plurality of $R_1$'s is the same as or different from each other even though being equally indicated, and these groups may form a fused ring with an adjacent group, $X_2$ to $X_3$ are the same as or different from each other, and are each independently N or C(R2), and in this case, a plurality of R2's is the same as or different from each other even though being equally indicated, and these groups may form a fused ring with an adjacent group, $R_1$ and $R_2$ and $Ar_1$ to $Ar_5$ are the same as or different from each other, and are each independently selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkyl boron group, the aryl boron group, the phosphine group, the phosphine oxide group, and the arylamine group of $R_1$ and $R_2$ and $Ar_1$ to $Ar_5$ are each independently unsubstituted or substituted with one or more selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group.

In the present disclosure, Chemical Formula 1 may be more embodied as any one of the following A-1 to A-24. However, Chemical Formula 1 is not limited thereto.

A-1

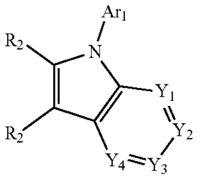

A-2

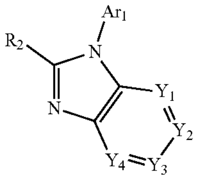

A-3

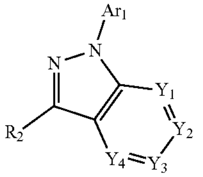

A-4

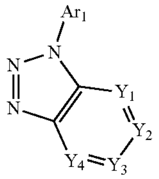

A-5

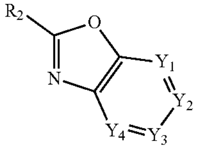

A-6

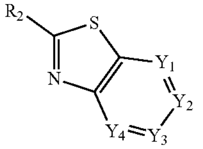

A-7

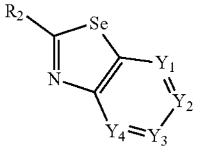

A-8

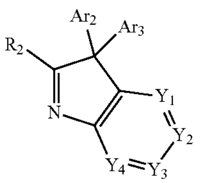

-continued

A-9

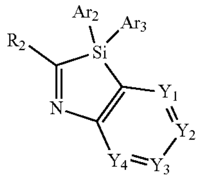

A-10

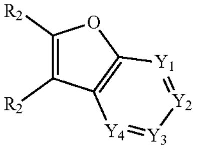

A-11

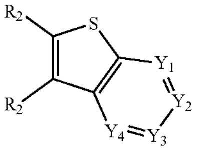

A-12

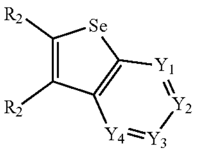

A-13

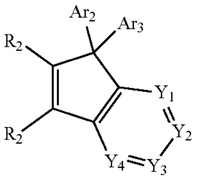

A-14

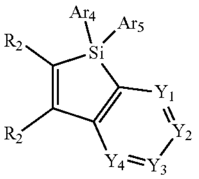

A-15

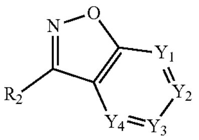

A-16

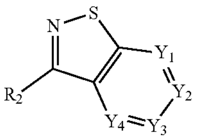

A-17

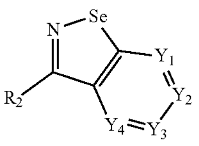

-continued

A-18

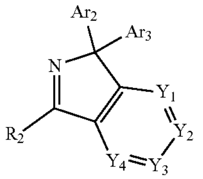

A-19

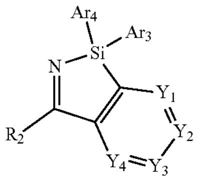

A-20

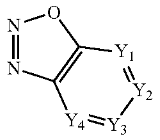

A-21

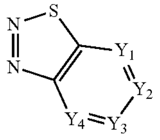

A-22

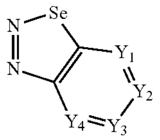

A-23

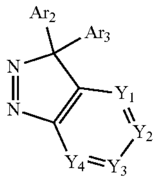

A-24

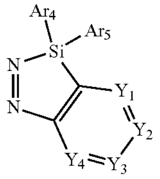

In A-1 to A-24, the definitions of $R_2$, $Y_1$ to $Y_4$, and $Ar_1$ to $Ar_5$ are the same as those in the above-described Chemical Formula 1. In this case, in consideration of physical and chemical characteristics of the compound, the electron donor group (EDG) moiety is preferably A-1 to A-6.

Meanwhile, Chemical Formula 1, which is the electron donor group (EDG) moiety in the present disclosure, may be used alone as the structure of Chemical Formula 1, or may combine with the following Chemical Formula 2 or Chemical Formula 3 to be represented as a fused structure.

More specifically, $Y_1$ to $Y_4$ in Chemical Formula 1 are each independently N or $C(R_1)$, and when these groups are a plurality of $C(R_1)$'s, one of $Y_1$ and $Y_2$, $Y_2$ and $Y_3$ or $Y_3$ and $Y_4$ forms a fused ring with the following Chemical Formula 2. In this case, a plurality of $R_1$'s may be the same as or different from each other.

Further, when both $X_2$ and $X_3$ in Chemical Formula 1 are $C(R_2)$, a plurality of $R_2$'s in this case may each combine with the following Chemical Formula 2 or Chemical Formula 3 to form a fused ring.

[Chemical Formula 2]

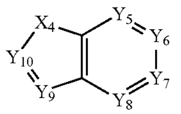

[Chemical Formula 3]

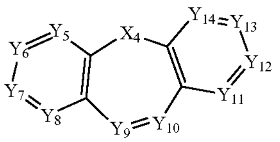

In Chemical Formulae 2 and 3, $Y_5$ to $Y_{14}$ are the same as or different from each other, and are each independently N or $C(R_3)$, and in this case, in the case of a plurality of $C(R_3)$'s, a plurality of $R_3$'s is the same as or different from each other, and may combine with Chemical Formula 1 to form a fused ring, and $X_4$ is the same as $X_1$, and in this case, a plurality of $Ar_1$'s to $Ar_5$'s is the same as or different from each other.

A plurality of $R_3$'s, which does not form a fused ring, is the same as or different from each other even though being equally indicated, and are each independently selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to Cao cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkyl boron group, the aryl boron group, the phosphine group, the phosphine oxide group, and the arylamine group of $R_3$ are each independently unsubstituted or substituted with one or more selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group.

In the present disclosure, the compound formed by fusing Chemical Formula 1 with Chemical Formula 2 may be more embodied as any one of compounds represented by the following Chemical Formulae 1a to 1f.

[Chemical Formula 1a]

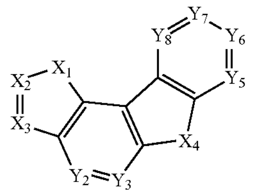

[Chemical Formula 1b]

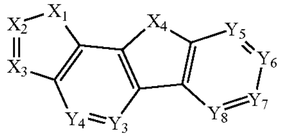

[Chemical Formula 1c]

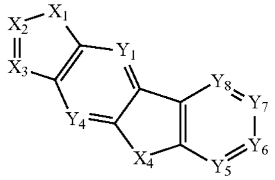

[Chemical Formula 1d]

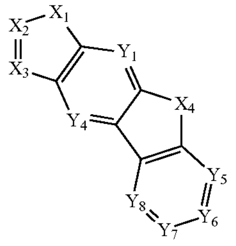

[Chemical Formula 1e]

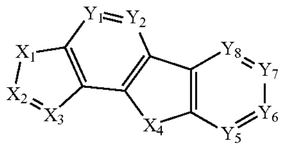

[Chemical Formula 1f]

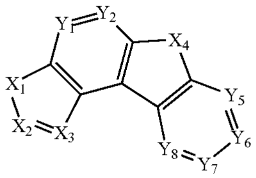

In Chemical Formulae 1a to 1f, $X_1$ to $X_4$ and $Y_1$ to $Y_8$ are the same as those defined in Chemical Formulae 1 and 2.

According to a preferred embodiment of the present disclosure, $Y_1$ to $Y_4$, which do not form a fused ring, are N or $C(R_1)$, and it is preferred that $Y_1$ to $Y_4$ are all $C(R_1)$, and $Y_5$ to $Y_8$ are N or $C(R_3)$, and it is preferred that all of $Y_5$ to $Y_8$ are $C(R_3)$. In this case, a plurality of $R_1$'s and $R_3$'s is the same as of different from each other.

The compound of the present disclosure, in which Chemical Formula 1 is fused with Chemical Formula 2, may be embodied as any one of the following Chemical Formulae B-1 to B-30. However, the compound is not limited thereto.

B-1
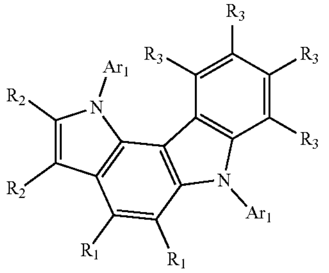
B-2
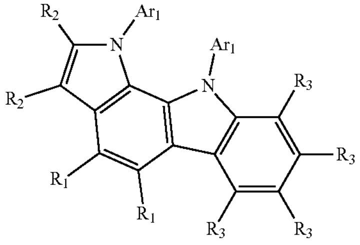
B-3
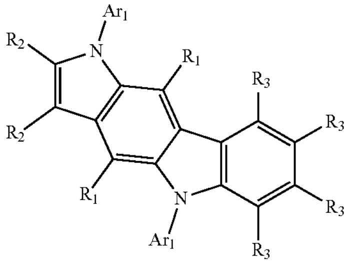
B-4
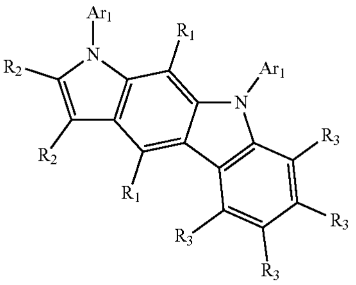
B-5
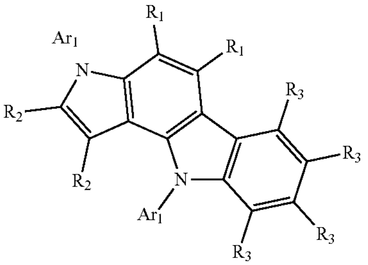
B-6
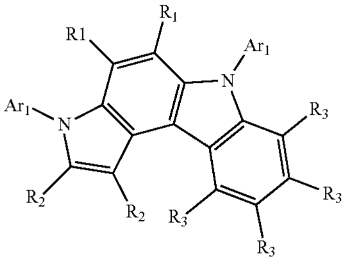
-continued
B-7
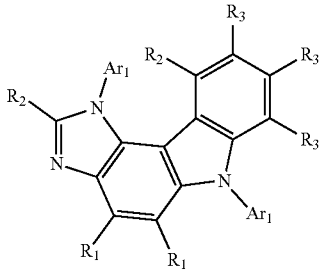
B-8
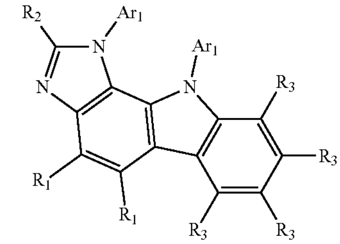
B-9
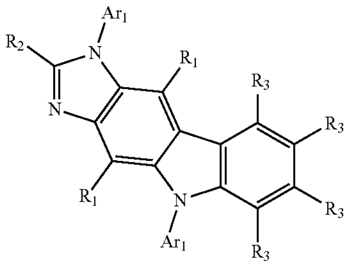
B-10
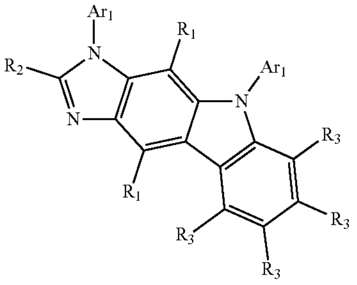
B-11
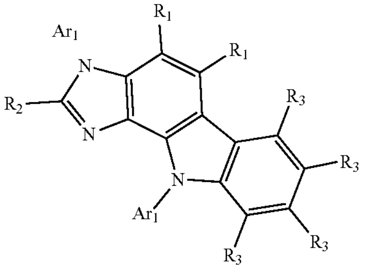
B-12
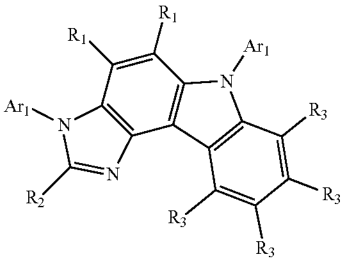

-continued
B-13
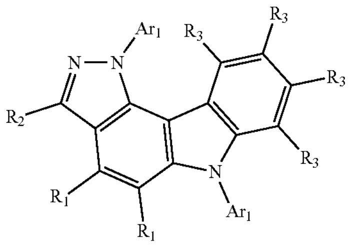
B-14
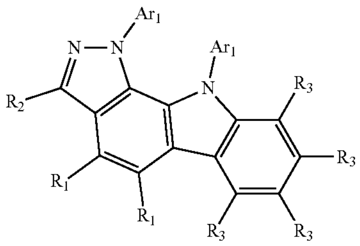
B-15
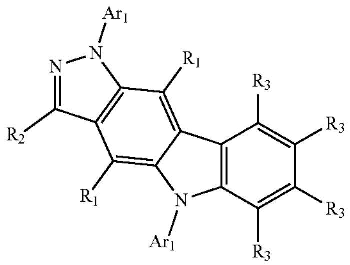
B-16
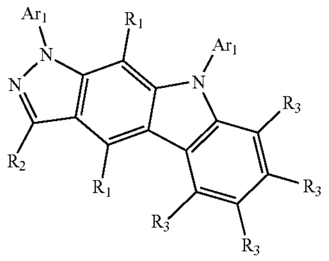
B-17
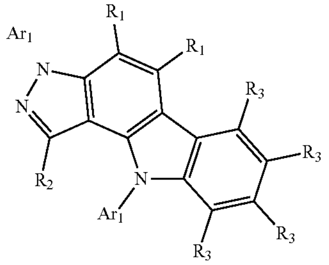
B-18
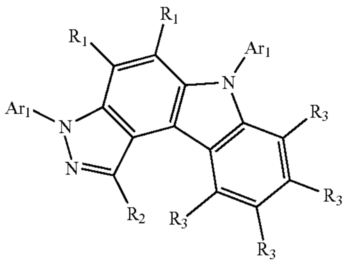
-continued
B-19
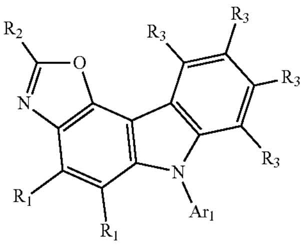
B-20
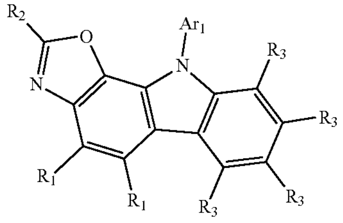
B-21
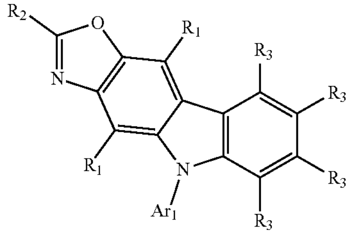
B-22
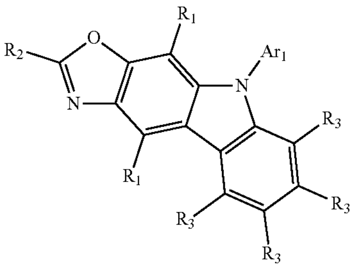
B-23
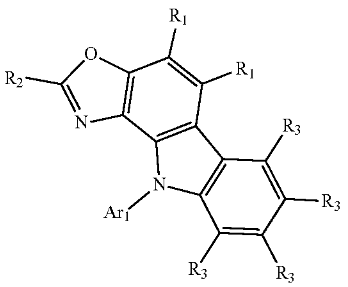
B-24
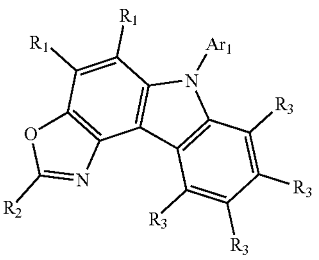

-continued

B-25

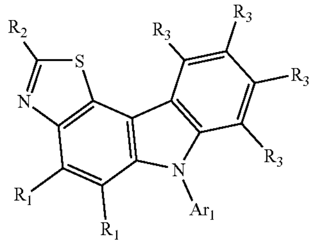

B-26

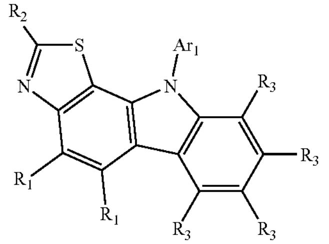

B-27

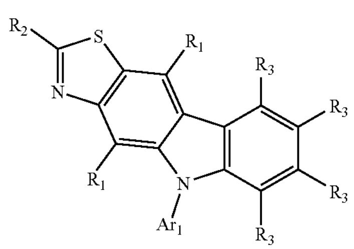

B-28

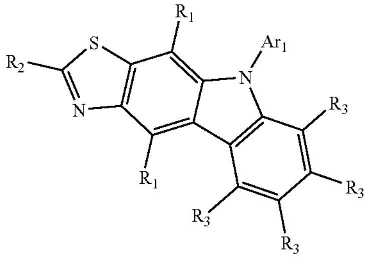

B-29

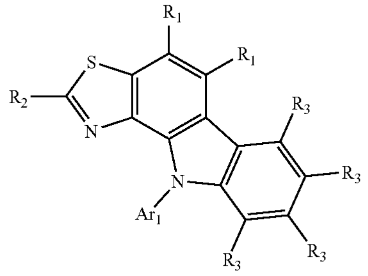

B-30

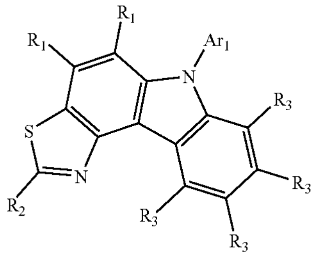

In Chemical Formulae B-1 to B-30, $Ar_1$ and $R_1$ to $R_3$ are the same as those defined in Chemical Formulae 1 and 2.

More specifically, $Ar_1$ is a substituted or unsubstituted $C_6$ to $C_{40}$ aryl group, or a substituted or unsubstituted heteroaryl group having 5 to 40 nuclear atoms, and it is preferred that $R_1$ to $R_3$ are each independently hydrogen, a substituted or unsubstituted $C_1$ to $C_{40}$ alkyl group, a substituted or unsubstituted $C_6$ to $C_{40}$ aryl group, or a substituted or unsubstituted heteroaryl group having 5 to 40 nuclear atoms.

Here, Chemical Formulae B-1 to B-30 having a structure in which Chemical Formula 1 and Chemical Formula 2 are fused include one or more fused indole or fused carbazole moieties.

Further, in the present disclosure, the compound formed by fusing Chemical Formula 1 with Chemical Formula 3 may be embodied as any one of compounds represented by the following Chemical Formulae 1g to 1n:

[Chemical Formula 1g]

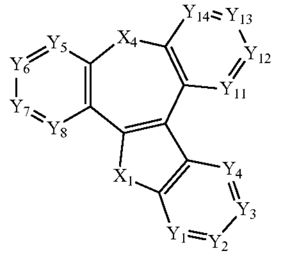

[Chemical Formula 1h]

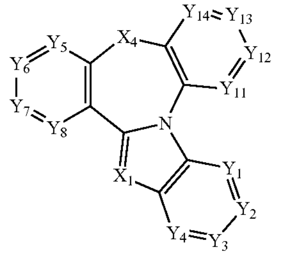

[Chemical Formula 1i]

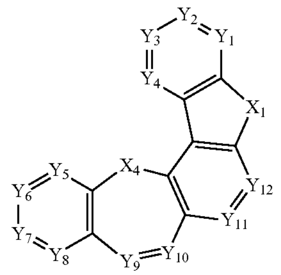

[Chemical Formula 1j]

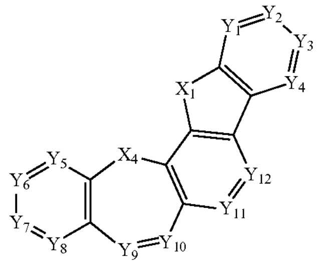

-continued

[Chemical Formula 1k]

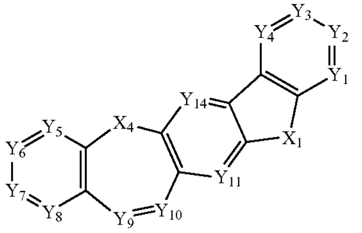

[Chemical Formula 1l]

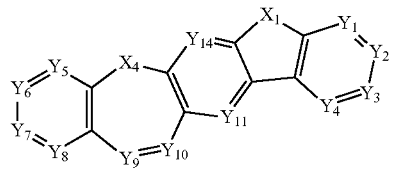

[Chemical Formula 1m]

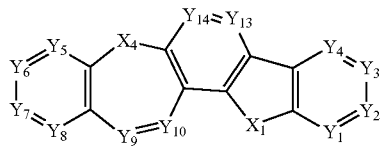

[Chemical Formula 1n]

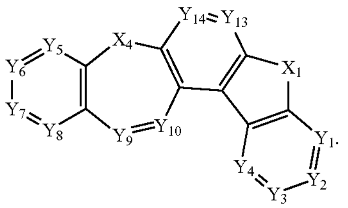

In Chemical Formulae 1g to 1n, $X_1$, $X_3$, $X_4$, and $Y_1$ to $Y_{14}$ are the same as those defined in Chemical Formulae 1 and 3.

More specifically, $X_1$ and $X_4$ are the same as or different from each other, and are each independently preferably O, S or $N(Ar_1)$, and both $X_1$ and $X_4$ are more preferably $N(Ar_1)$. In this case, a plurality of $Ar_1$'s is the same as or different from each other.

$Y_1$ to $Y_4$ are the same as or different from each other, and are each independently N or $C(R_1)$, and all of $Y_1$ to $Y_4$ are preferably $C(R_1)$. In this case, a plurality of $R_1$'s is the same as or different from each other.

$X_3$'s are each independently N or $C(R_2)$, $Y_5$ to $Y_{14}$ are the same as or different from each other, and are each independently N or $C(R_3)$, and all of $Y_5$ to $Y_{14}$ are preferably $C(R_3)$. In this case, a plurality of $R_3$'s is the same as or different from each other.

Here, $Ar_1$ and $R_1$ to $R_3$ are the same as those defined in Chemical Formulae 1 and 3.

According to an exemplary embodiment of the present disclosure, it is preferred that in Chemical Formulae 1a to 1n, $X_1$ and $X_4$ are each independently $N(Ar_1)$ or S. That is, it is preferred that $X_1$ is $N(Ar_1)$ and $X_4$ is S, or $X_1$ is S and $X_4$ is $N(Ar_1)$, or both $X_1$ and $X_4$ are $N(Ar_1)$.

Further, in Chemical Formulae 1a to 1n, $Ar_1$ is preferably a substituted or unsubstituted $C_6$ to $C_{60}$ aryl group, or a substituted or unsubstituted heteroaryl group having 5 to 60 nuclear atoms, and Are to $Ar_5$ are the same as or different from each other, and are each independently preferably a substituted or unsubstituted $C_1$ to $C_{40}$ alkyl group (specifically, a methyl group), or a substituted or unsubstituted $C_6$ to $C_{60}$ aryl group (specifically, a phenyl group).

Here, the chemical formulae having a structure in which Chemical Formulae 1 and 3 are fused include one or more fused azepine moieties and thus have an electron donor group (EDG) characteristic with a high electron donor property.

Meanwhile, in the present disclosure, the bipolar compound included as a material for the lifetime enhancement layer may include a moiety having an electron donor group characteristic with a high electron donor property, which is represented by the following Chemical Formula 4:

[Chemical Formula 4]

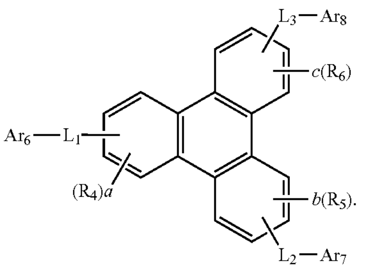

In Chemical Formula 4, $L_1$ to $L_3$ are the same as or different from each other, and are each independently selected from the group consisting of a single bond, a $C_6$ to $C_{60}$ arylene group, and a heteroarylene group having 5 to 60 nuclear atoms, $Ar_6$ to $Ar_8$ are the same as or different from each other, and are each independently selected from the group consisting of hydrogen, deuterium, a $C_6$ to $C_{40}$ aryl group, and a heteroaryl group having 5 to 40 nuclear atoms, provided that the case where all of $Ar_6$ to $Ar_8$ are the same is excluded, $R_4$ to $R_6$ are the same as or different from each other, and are each independently selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to Cao cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{ho}$ aryl boron group, a $C_1$ to $C_{40}$ phosphine group, a $C_1$ to $C_{40}$ phosphine oxide group, and a $C_6$ to $C_{60}$ arylamine group, a to c are each independently an integer of 0 to 3, and the arylene group, the heteroarylene group, the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkyl boron group, the aryl boron group, the phosphine group, the phosphine oxide group, and the arylamine group of $L_1$ to $L_3$, $R_4$ to $R_6$, and $Ar_6$ to $Ar_8$ are each independently unsubstituted or substituted with one or more selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group.

More specifically, it is preferred that in Chemical Formula 4, $L_1$ to $L_3$ are each independently a single bond, phenylene, biphenylene, or carbazolylene.

$Ar_6$ to $Ar_8$ are the same as or different from each other, and are each independently selected from the group consisting of hydrogen, deuterium, a $C_6$ to $C_{40}$ aryl group, and a heteroaryl group having 5 to 40 nuclear atoms, and in this case, at least one of $Ar_6$ to $Ar_8$ is preferably selected from a heteroaryl group having 5 to 40 nuclear atoms, which includes one or more elements selected from the group consisting of N, O, and S. Provided that the case where all of $Ar_6$ to $Ar_8$ are the same is excluded.

In the present disclosure, in the compounds represented by Chemical Formulae 1a to 1n and Chemical Formula 4, at least one of $R_1$ to $R_6$ and $Ar_1$ to $Ar_8$ forms a bond with the moiety having an electron withdrawal group (EWG) characteristic with a high electron absorption property.

The alkyl in the present disclosure is a monovalent substituent derived from a linear or branched saturated hydrocarbon having 1 to 40 carbon atoms, and examples thereof include methyl, ethyl, propyl, isobutyl, sec-butyl, pentyl, iso-amyl, hexyl, and the like.

The alkenyl in the present disclosure is a monovalent substituent derived from a linear or branched unsaturated hydrocarbon having 2 to 40 carbon atoms, which has one or more carbon-carbon double bonds, and examples thereof include vinyl, allyl, isopropenyl, 2-butenyl, and the like.

The alkynyl in the present disclosure is a monovalent substituent derived from a linear or branched unsaturated hydrocarbon having 2 to 40 carbon atoms, which has one or more carbon-carbon triple bonds, and examples thereof include ethynyl, 2-propynyl, and the like.

The aryl in the present disclosure means a monovalent substituent derived from an aromatic hydrocarbon having 6 to 60 carbon atoms, which has a single ring or a combination of two or more rings. Further, a form in which two or more rings are simply pendant to or fused with each other may also be included. Examples of the aryl include phenyl, naphthyl, phenanthryl, anthryl, and the like.

The heteroaryl in the present disclosure means a monovalent substituent derived from a monoheterocyclic or polyheterocyclic aromatic hydrocarbon having 5 to 60 nuclear atoms. In this case, one or more carbons, preferably 1 to 3 carbons in the ring are substituted with a heteroatom such as N, O, S, or Se. Further, a form in which two or more rings are simply pendant to or fused with each other may also be included, and a fused form with an aryl group may also be included. Examples of the heteroaryl include a six-membered monocyclic ring such as pyridyl, pyrazinyl, pyrimidinyl, pyridazinyl, and triazinyl, a polycyclic ring such as phenoxathienyl, indolizinyl, indolyl, purinyl, quinolyl, benzothiazole, and carbazolyl, 2-furanyl, N-imidazolyl, 2-isoxazolyl, 2-pyridinyl, 2-pyrimidinyl, and the like.

The aryloxy in the present disclosure means a monovalent substituent represented by RO—, in which R is an aryl having 6 to 60 carbon atoms. Examples of the aryloxy include phenyloxy, naphthyloxy, diphenyloxy, and the like.

The alkyloxy in the present disclosure means a monovalent substituent represented by R'O—, in which R' is an alkyl having 1 to 40 carbon atoms, and is interpreted as including a linear, branched, or cyclic structure. Examples of the alkyloxy include methoxy, ethoxy, n-propoxy, 1-propoxy, t-butoxy, n-butoxy, pentoxy, and the like.

The arylamine in the present disclosure means an amine substituted with an aryl having 6 to 60 carbon atoms.

The cycloalkyl in the present disclosure means a monovalent substituent derived from a monocyclic or polycyclic non-aromatic hydrocarbon having 3 to 40 carbon atoms. Examples of the cycloalkyl include cyclopropyl, cyclopentyl, cyclohexyl, norbornyl, adamantine, and the like.

The heterocycloalkyl in the present disclosure means a monovalent substituent derived from a non-aromatic hydrocarbon having 3 to 40 nuclear atoms, and one or more carbons, preferably 1 to 3 carbons in the ring are substituted with a hetero atom such as N, O, S, or Se. Examples of the heterocycloalkyl include morpholine, piperazine, and the like.

The alkylsilyl in the present disclosure is a silyl substituted with an alkyl having 1 to 40 carbon atoms, and the arylsilyl means a silyl substituted with an aryl having 6 to 40 carbon atoms.

The fused ring in the present disclosure means a fused aliphatic ring, a fused aromatic ring, a fused heteroaliphatic ring, a fused heteroaromatic ring, or a combined form thereof.

In the organic electroluminescent device according to the present disclosure, the electron transporting layer 305 and the electron injection layer 306 included in the organic material layer 300 serve to transport electrons injected from the cathode 200 to the light emitting layer 303.

A material, which constitutes the electron transporting layer 305 and the electron injection layer 306, is not particularly limited as long as the material is a material which easily injects electrons and has high electron mobility, but non-limiting examples thereof include the bipolar compound, an anthracene derivative, a heteroaromatic compound, an alkali metal complex compound, and the like.

More specifically, it is preferred that the electron transporting layer 305 and/or the electron injection layer 306 of the present disclosure are/is composed of a bipolar material which is the same as the material constituting the lifetime enhancement layer 304, that is, the bipolar compound represented by Chemical Formula 1. Further, for the electron transporting layer 305 and the electron injection layer 306, it is also possible to use a material on which an alkali metal complex compound is co-deposited such that electrons are easily injected from the cathode. In this case, examples of the alkali metal complex compound include an alkali metal, an alkali earth metal, or a rare earth metal, and the like.

The organic material layer 300 of the present disclosure as described above may further include an organic film layer (not illustrated) which blocks electrons and excitons between the hole transporting layer 302 and the light emitting layer 303.

The organic film layer has a high LUMO value to block electrons from moving into the hole transporting layer 302, and has high triplet energy to prevent excitons in the light emitting layer 303 from diffusing into the hole transporting layer 302. The material, which constitutes the organic film layer, is not particularly limited, and non-limiting examples thereof include a carbazole derivative or an arylamine derivative, and the like.

The method for preparing the organic material layer 300 of the present disclosure is not particularly limited, but non-limiting examples thereof include a vacuum deposition method and a solution application method. Examples of the solution application method include spin coating, dip coating, doctor blading, inkjet printing, a thermal transfer method, and the like.

The organic electroluminescent device of the present disclosure has a structure in which the anode 100, the organic material layer 300, and the cathode 200 are sequentially laminated, and may further include an insulation layer or an adhesive layer between the anode 100 and the organic material layer 300, or between the cathode 200 and the organic material layer 300. Since the organic electroluminescent device of the present disclosure increases the lifetime of the initial brightness while maintaining the maximum light emitting efficiency when voltage, current, or both voltage and current are applied thereto, the lifetime characteristics thereof may be excellent.

Hereinafter, the present disclosure will be described in detail through the Examples, but the following Examples only exemplify the present disclosure, and the present disclosure is not limited by the following Examples.

[Preparation Examples 1 to 36] Preparation of Compounds LE-01 to LE-36

As the bipolar compound of the present disclosure, compounds represented by the following LE-01 to LE-36 were prepared, ΔEst, triplet energy, ionization potential, $E_{HOMO}$−$E_{LUMO}$, electron mobility, and hole mobility of these compounds were each measured by methods publicly known in the art, and the results are shown in the following Table 1.

The bipolar compounds LE-01 to LE-36 are each illustrated below:

LE-01

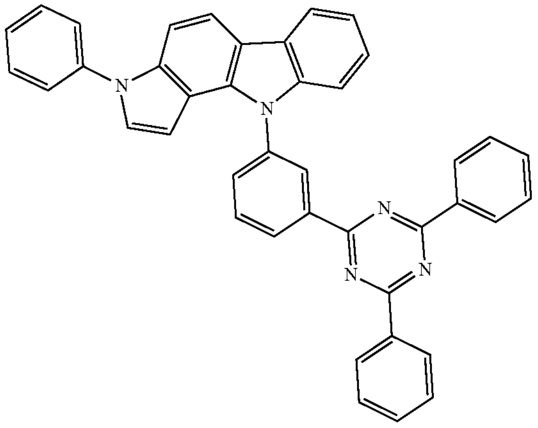

LE-02

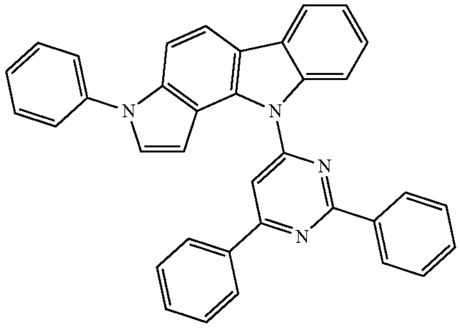

-continued

LE-03

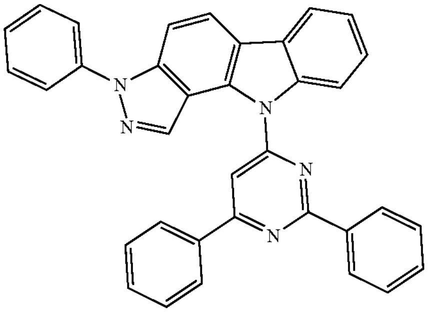

LE-04

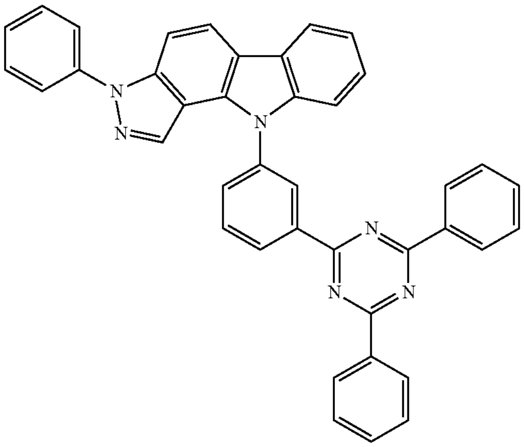

LE-05

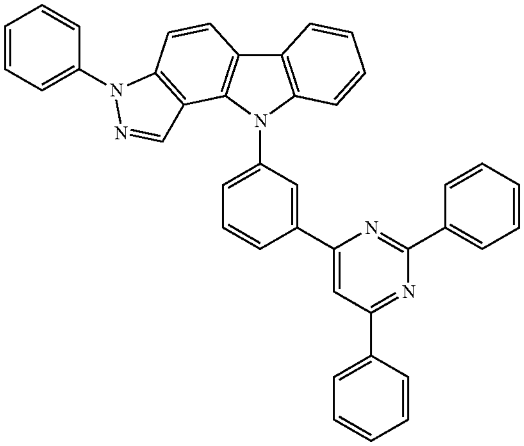

-continued
LE-06
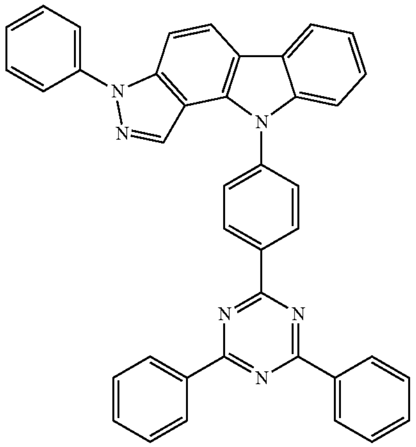
LE-07
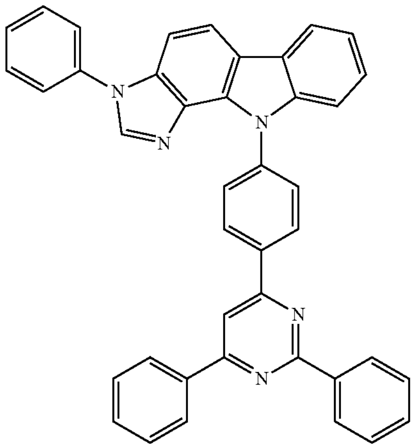
LE-08
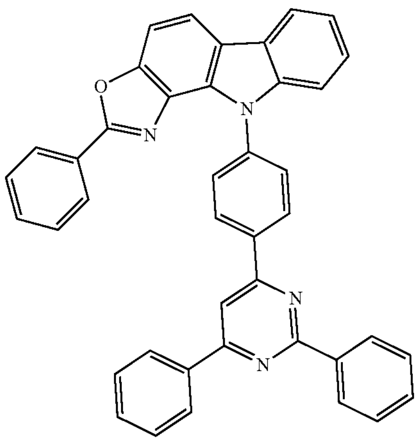
-continued
LE-09
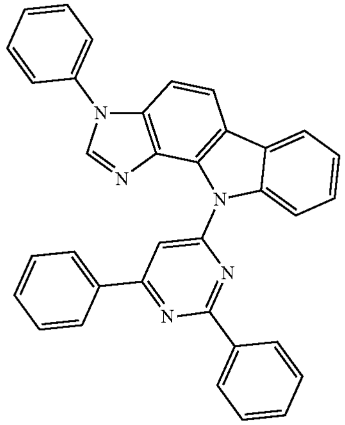
LE-10
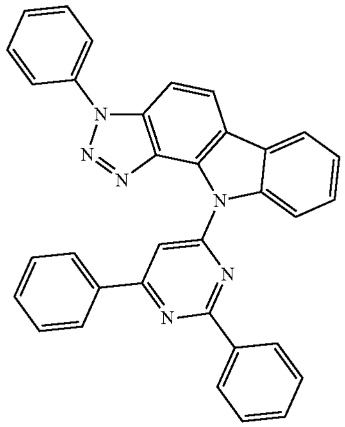
LE-11
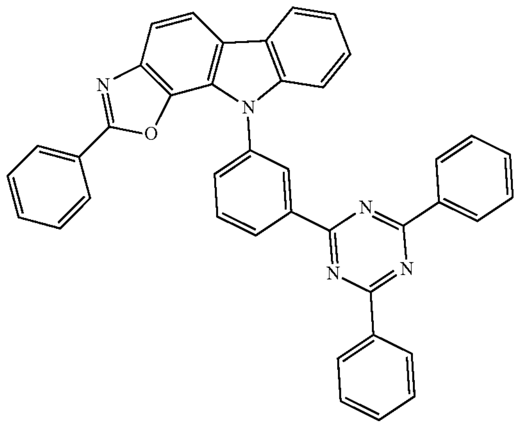

-continued
LE-12
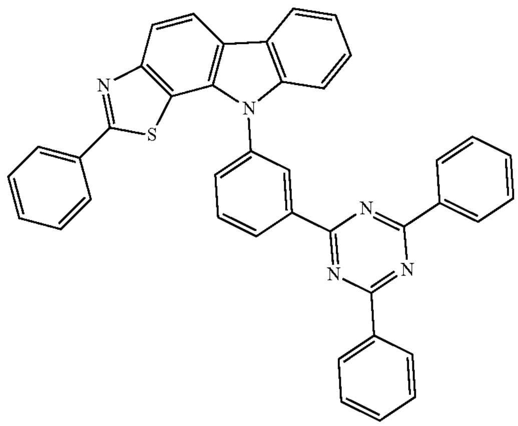
LE-13
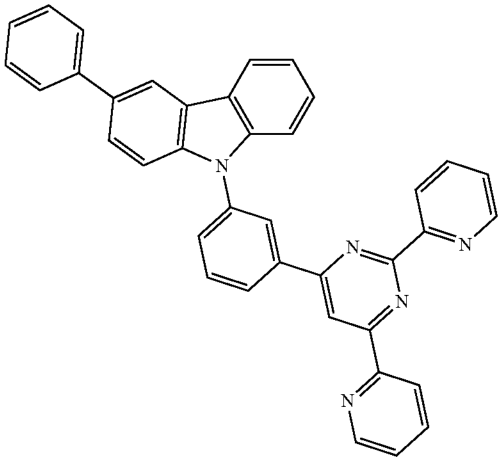
LE-14
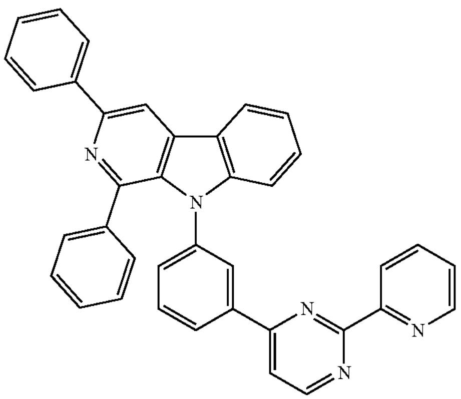
-continued
LE-15
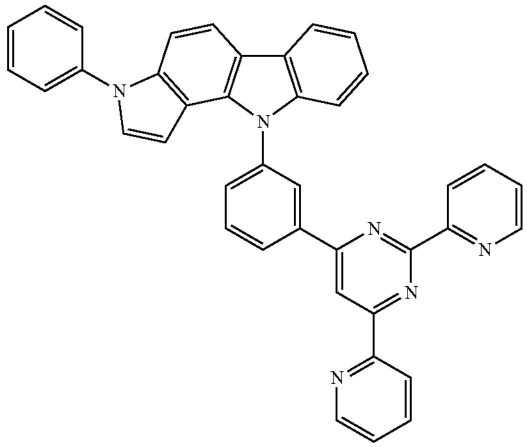
LE-16
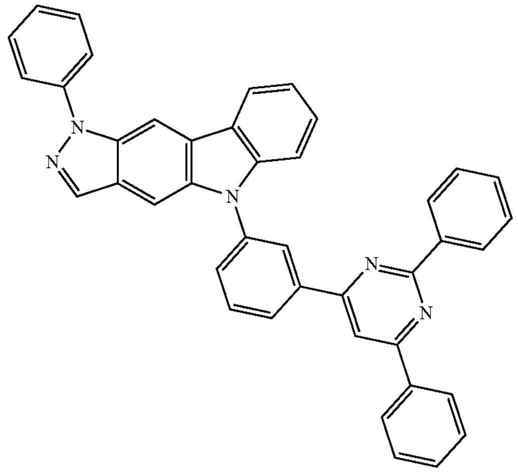
LE-17
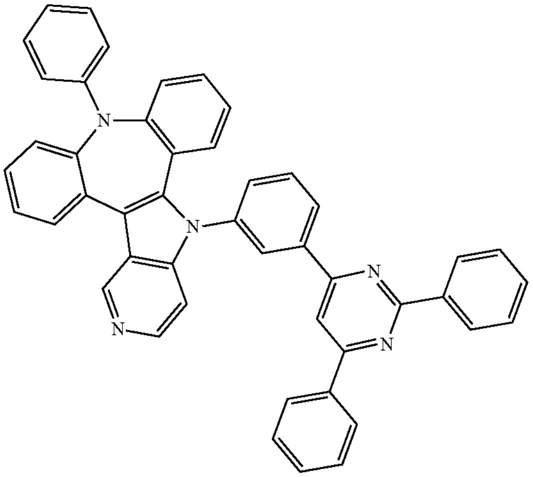

-continued
LE-18
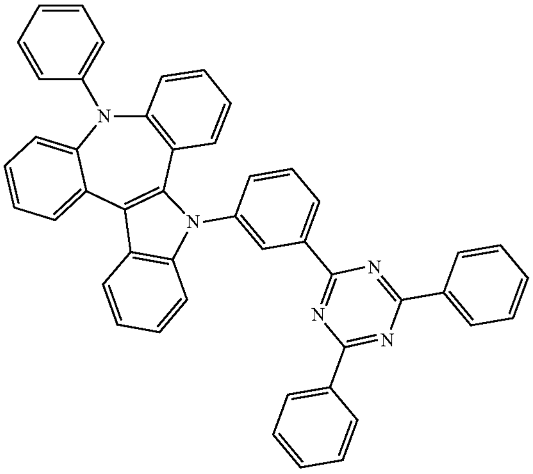
LE-19
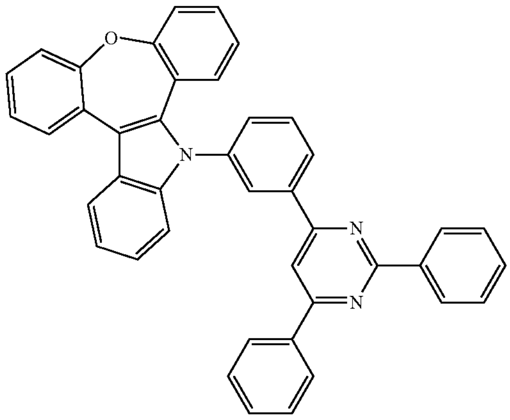
LE-20
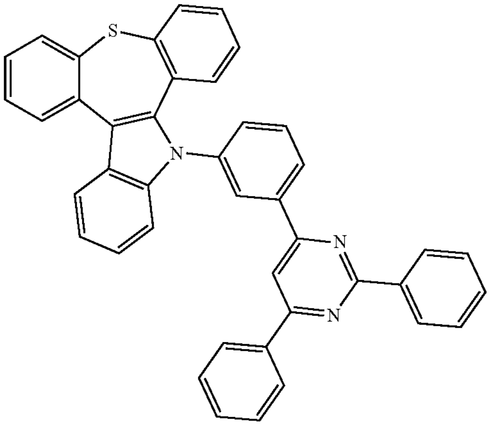
-continued
LE-21
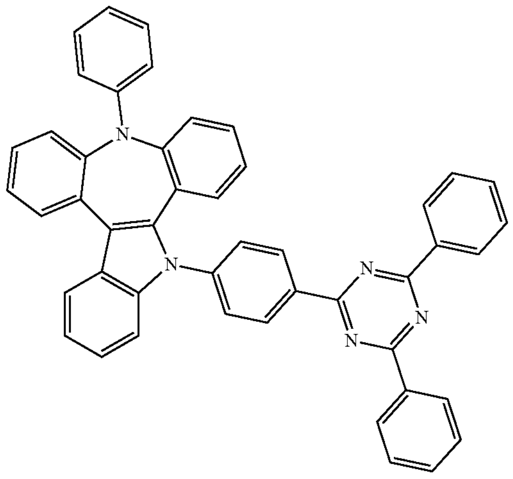
LE-22
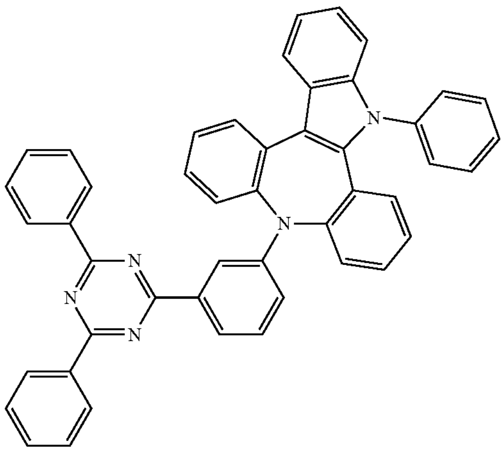
LE-23
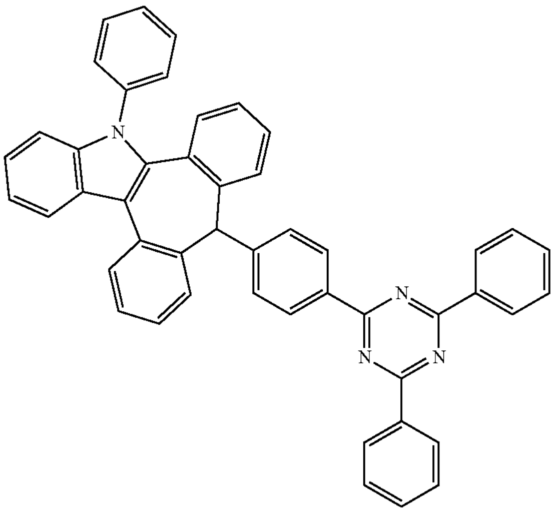

-continued
LE-24
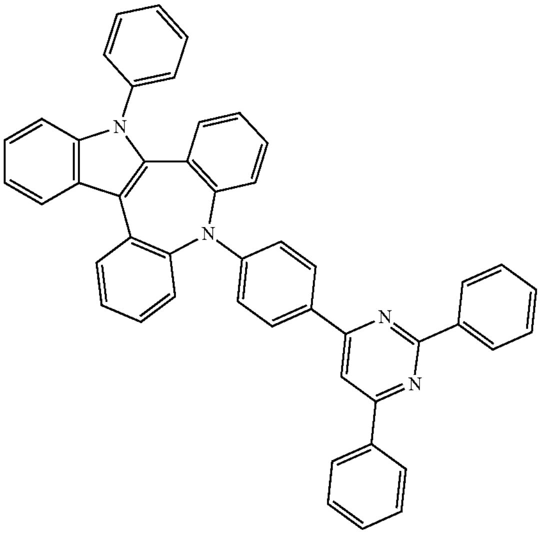
LE-25
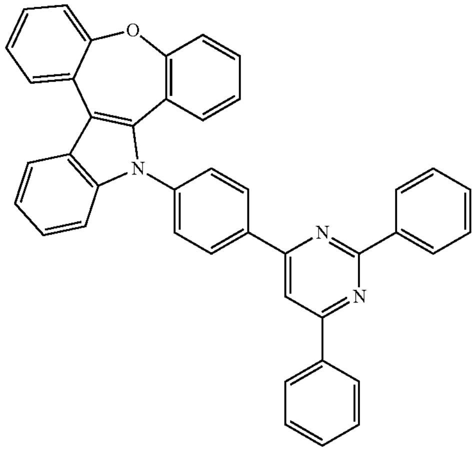
LE-26
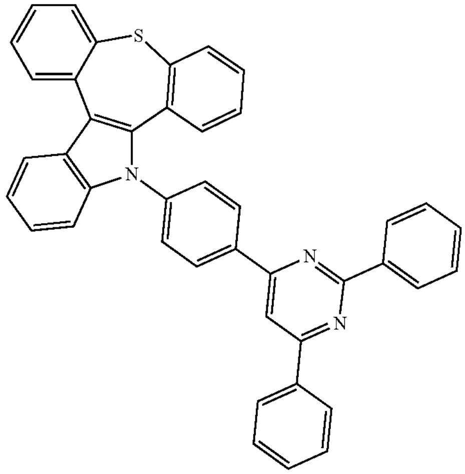
-continued
LE-27
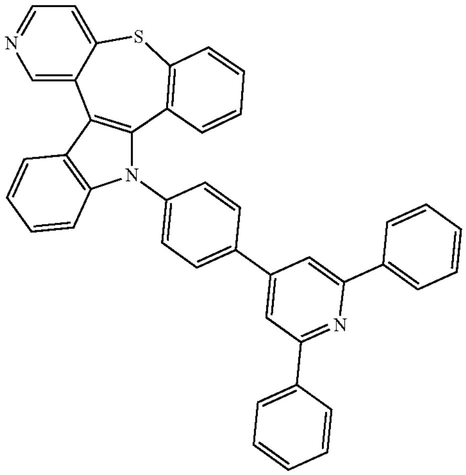
LE-28
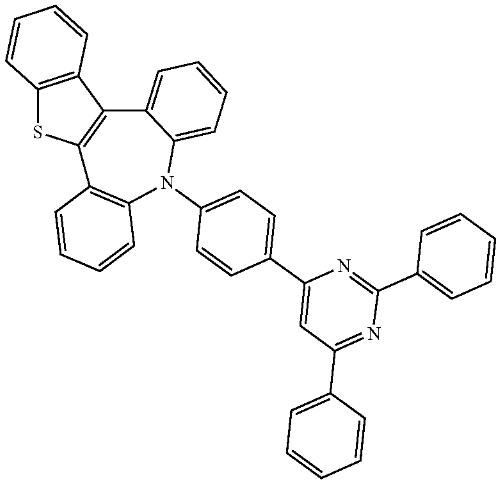
LE-29
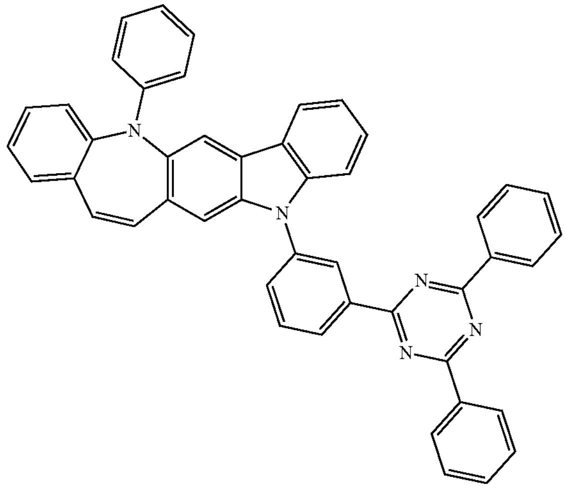

-continued
LE-30
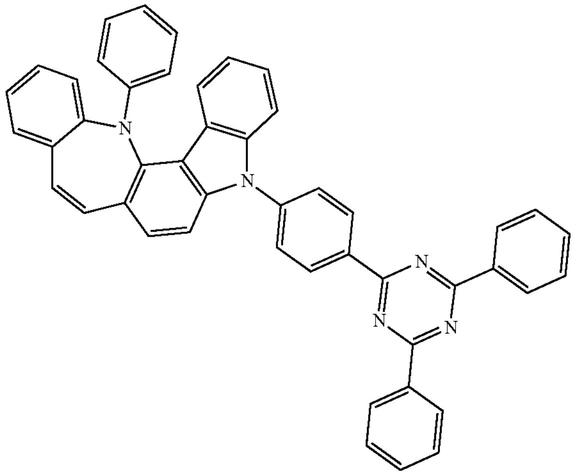
LE-31
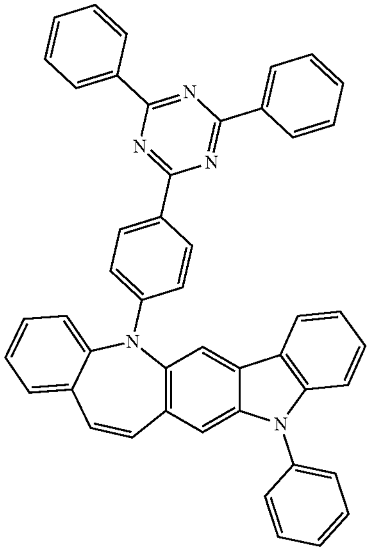
LE-32
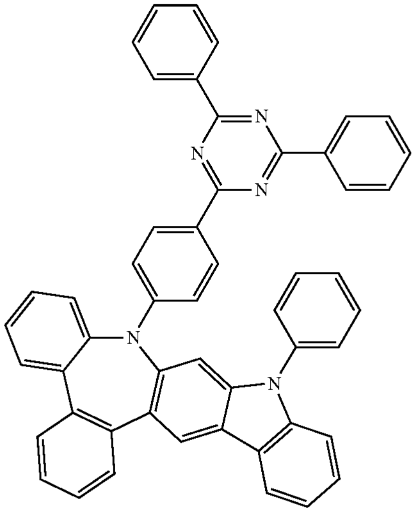
-continued
LE-33
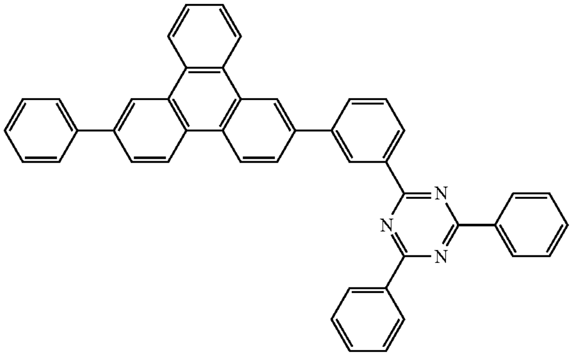
LE-34
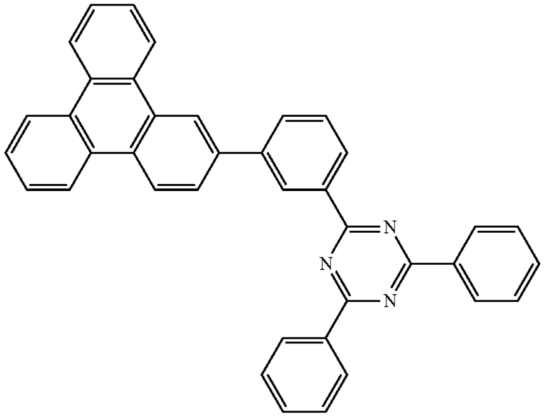
LE-35
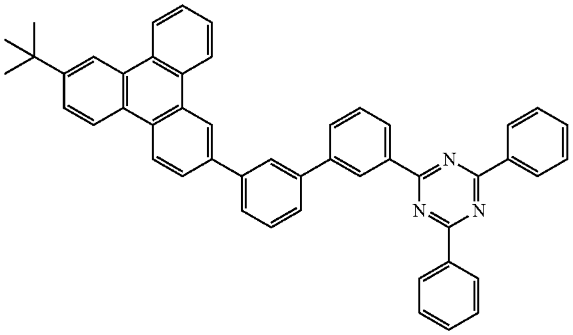

-continued

LE-36

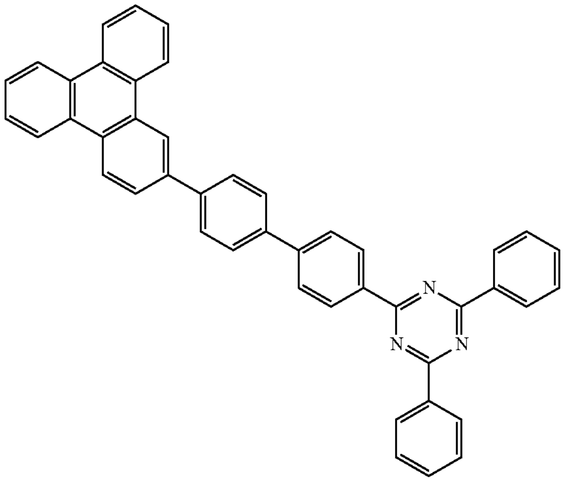

TABLE 1

| Bipolar compound | Calculated value (B3LYP/6-31G*) ΔEst (S1-T1) | Triplet energy | Actually measured value Ionization potential | $E_{HOMO}$-$E_{LUMO}$ | Electron mobility | Hole mobility |
|---|---|---|---|---|---|---|
| LE-01 | 0.058 | 2.39 | 5.54 | 3.55 | $8.9 \times 10^{-5}$ | $5.5 \times 10^{-5}$ |
| LE-02 | 0.168 | 2.45 | 5.50 | 3.47 | $5.8 \times 10^{-5}$ | $3.3 \times 10^{-5}$ |
| LE-03 | 0.355 | 2.54 | 5.71 | 3.3 | $8.8 \times 10^{-4}$ | $1.1 \times 10^{-5}$ |
| LE-04 | 0.059 | 2.53 | 5.6 | 3.37 | $7.6 \times 10^{-4}$ | $1.2 \times 10^{-5}$ |
| LE-05 | 0.138 | 2.65 | 5.58 | 3.43 | $7.5 \times 10^{-4}$ | $9.0 \times 10^{-5}$ |
| LE-06 | 0.177 | 2.50 | 5.64 | 3.07 | $9.6 \times 10^{-4}$ | $9.9 \times 10^{-5}$ |
| LE-07 | 0.121 | 2.48 | 5.65 | 3.42 | $9.2 \times 10^{-4}$ | $9.6 \times 10^{-5}$ |
| LE-08 | 0.298 | 2.74 | 6.01 | 3.33 | $5.1 \times 10^{-5}$ | $5.5 \times 10^{-5}$ |
| LE-09 | 0.291 | 2.38 | 5.71 | 3.32 | $9.9 \times 10^{-4}$ | $2.5 \times 10^{-5}$ |
| LE-10 | 0.321 | 2.35 | 5.69 | 3.31 | $1.0 \times 10^{-5}$ | $6.5 \times 10^{-5}$ |
| LE-11 | 0.261 | 2.81 | 6.01 | 3.36 | $9.9 \times 10^{-5}$ | $4.1 \times 10^{-5}$ |
| LE-12 | 0.340 | 2.78 | 6.05 | 3.23 | $1.1 \times 10^{-6}$ | $5.4 \times 10^{-5}$ |
| LE-13 | 0.235 | 2.59 | 5.50 | 3.51 | $1.3 \times 10^{-6}$ | $1.1 \times 10^{-5}$ |
| LE-14 | 0.265 | 2.51 | 5.51 | 3.41 | $2.1 \times 10^{-6}$ | $1.6 \times 10^{-5}$ |
| LE-15 | 0.049 | 2.59 | 5.56 | 3.50 | $7.5 \times 10^{-5}$ | $5.5 \times 10^{-5}$ |
| LE-16 | 0.051 | 2.54 | 5.51 | 3.49 | $8.5 \times 10^{-6}$ | $4.5 \times 10^{-5}$ |
| LE-17 | 0.058 | 2.43 | 5.64 | 3.15 | $7.8 \times 10^{-5}$ | $5.0 \times 10^{-5}$ |
| LE-18 | 0.074 | 2.50 | 5.68 | 3.24 | $6.5 \times 10^{-4}$ | $4.2 \times 10^{-5}$ |
| LE-19 | 0.082 | 2.45 | 5.73 | 3.20 | $7.5 \times 10^{-4}$ | $8.5 \times 10^{-5}$ |
| LE-20 | 0.168 | 2.56 | 5.70 | 3.17 | $5.8 \times 10^{-5}$ | $3.3 \times 10^{-5}$ |
| LE-21 | 0.235 | 2.48 | 5.60 | 3.14 | $6.4 \times 10^{-4}$ | $6.1 \times 10^{-5}$ |
| LE-22 | 0.129 | 2.57 | 5.70 | 2.93 | $7.0 \times 10^{-4}$ | $4.2 \times 10^{-5}$ |
| LE-23 | 0.090 | 2.53 | 5.83 | 3.54 | $7.0 \times 10^{-5}$ | $5.5 \times 10^{-5}$ |
| LE-24 | 0.044 | 2.47 | 5.69 | 3.06 | $6.6 \times 10^{-3}$ | $9.1 \times 10^{-5}$ |
| LE-25 | 0.157 | 2.43 | 5.99 | 3.10 | $8.1 \times 10^{-4}$ | $7.9 \times 10^{-5}$ |
| LE-26 | 0.054 | 2.39 | 5.82 | 3.23 | $9.5 \times 10^{-3}$ | $9.4 \times 10^{-5}$ |
| LE-27 | 0.121 | 2.41 | 5.75 | 3.12 | $3.7 \times 10^{-4}$ | $4.8 \times 10^{-5}$ |
| LE-28 | 0.057 | 2.50 | 6.01 | 3.33 | $5.1 \times 10^{-5}$ | $5.5 \times 10^{-5}$ |
| LE-29 | 0.045 | 2.37 | 6.19 | 3.36 | $3.9 \times 10^{-4}$ | $8.1 \times 10^{-5}$ |
| LE-30 | 0.244 | 2.45 | 6.09 | 3.35 | $5.6 \times 10^{-4}$ | $7.5 \times 10^{-5}$ |
| LE-31 | 0.235 | 2.40 | 5.70 | 3.14 | $6.4 \times 10^{-4}$ | $6.1 \times 10^{-5}$ |
| LE-32 | 0.129 | 2.34 | 5.68 | 2.93 | $7.0 \times 10^{-4}$ | $4.2 \times 10^{-5}$ |
| LE-33 | 0.342 | 2.55 | 6.21 | 3.23 | $7.5 \times 10^{-4}$ | $5.9 \times 10^{-5}$ |
| LE-34 | 0.295 | 2.47 | 6.15 | 3.06 | $6.6 \times 10^{-3}$ | $9.1 \times 10^{-5}$ |
| LE-35 | 0.310 | 2.43 | 6.09 | 3.10 | $8.1 \times 10^{-4}$ | $7.9 \times 10^{-5}$ |
| LE-36 | 0.265 | 2.39 | 6.18 | 3.23 | $9.5 \times 10^{-3}$ | $9.4 \times 10^{-5}$ |

The hole mobility and the electron mobility were measured by forming a film having a thickness of 1 μm from the bipolar compound to measure the transit time of the carrier.

[Examples 1 to 36] Manufacture of Blue Fluorescent Organic Electroluminescent Device A glass substrate thinly coated with indium tin oxide (ITO) to have a thickness of 1,500 Å was ultrasonically washed with distilled water. When the washing with distilled water was completed, the substrate was ultrasonically washed with a solvent such as isopropyl alcohol, acetone, and methanol, dried, transferred to a UV ozone cleaner (Power sonic 405, manufactured by Hwashin Tech), cleaned for 5 minutes by using UV, and then transferred to a vacuum evaporator.

A device was manufactured by sequentially depositing a hole injection layer, a hole transporting layer, a light emitting layer, a lifetime enhancement layer, an electron transporting layer, an electron injection layer, and a cathode in this order on the ITO transparent electrode (substrate) prepared as described above. The structure of the manufactured device is shown in the following Table 2.

TABLE 2

| | Compound | Thickness |
|---|---|---|
| Hole injection layer | DS-205 (Doosan) | 80 nm |
| Hole transporting layer | NPB | 15 nm |
| Light emitting layer | ADN + 5% DS-405 (Doosan) | 30 nm |
| Lifetime enhancement layer | LE-01 to LE-36 | 5 nm |
| Electron transporting layer | $Alq_3$ | 25 nm |
| Electron injection layer | LiF | 1 nm |
| Cathode | Al | 200 nm |

The structures of NPB, AND, and $Alq_3$ used in Table 2 are as follows.

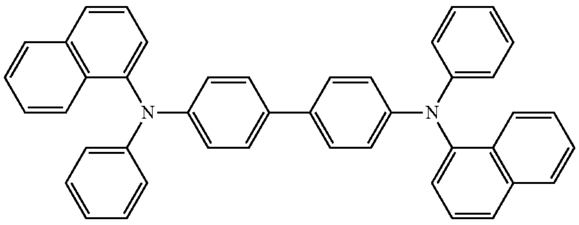

NPB

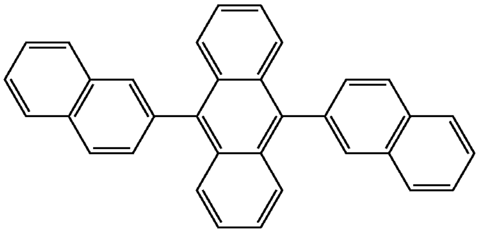

ADN

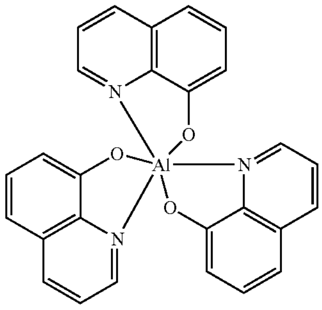

$Alq_3$

[Comparative Example 1] Manufacture of Blue Fluorescent Organic Electroluminescent Device A device was manufactured in the same manner as in Example 1, except that the electron transporting layer was deposited to have a thickness of 30 nm without using the lifetime enhancement layer.

[Comparative Example 2] Manufacture of Blue Fluorescent Organic Electroluminescent Device A device was manufactured in the same manner as in Example 1, except that BCP having the following structure was used instead of LE-01.

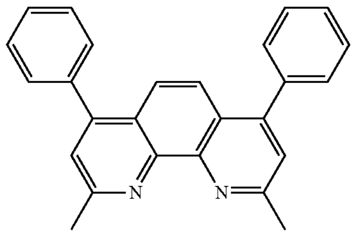

BCP

Experimental Example 1

For each of the devices manufactured in Examples 1 to 36 and Comparative Examples 1 and 2, the driving voltage, the current efficiency, the light emitting wavelength, and the lifetime ($T_{97}$) at a current density of 10 mA/cm$^2$ were measured, and the results are shown in the following Table 3.

TABLE 3

| | Compound | Driving voltage (V) | Current efficiency (cd/A) | Light emitting peak (nm) | Lifetime (hr) |
|---|---|---|---|---|---|
| Example 1 | LE-01 | 4.5 | 5.9 | 458 | 45 |
| Example 2 | LE-02 | 4.7 | 5.6 | 458 | 50 |
| Example 3 | LE-03 | 4.5 | 5.9 | 458 | 75 |
| Example 4 | LE-04 | 4.2 | 6.0 | 458 | 54 |
| Example 5 | LE-05 | 4.1 | 5.7 | 458 | 42 |
| Example 6 | LE-06 | 4.3 | 6.1 | 458 | 78 |
| Example 7 | LE-07 | 4.2 | 6.0 | 458 | 75 |
| Example 8 | LE-08 | 4.7 | 5.7 | 457 | 82 |
| Example 9 | LE-09 | 4.4 | 6.1 | 458 | 51 |
| Example 10 | LE-10 | 4.1 | 5.7 | 458 | 39 |
| Example 11 | LE-11 | 4.9 | 5.4 | 458 | 103 |
| Example 12 | LE-12 | 5.0 | 5.3 | 457 | 88 |
| Example 13 | LE-13 | 5.0 | 5.5 | 458 | 39 |
| Example 14 | LE-14 | 4.9 | 5.6 | 458 | 40 |
| Example 15 | LE-15 | 4.2 | 6.1 | 458 | 59 |
| Example 16 | LE-16 | 4.6 | 5.7 | 458 | 45 |
| Example 17 | LE-17 | 4.5 | 6.1 | 458 | 55 |
| Example 18 | LE-18 | 4.3 | 6.5 | 458 | 59 |
| Example 19 | LE-19 | 4.4 | 6.4 | 457 | 60 |
| Example 20 | LE-20 | 4.7 | 6.0 | 458 | 50 |
| Example 21 | LE-21 | 4.5 | 6.2 | 458 | 75 |
| Example 22 | LE-22 | 4.2 | 6.6 | 458 | 55 |
| Example 23 | LE-23 | 4.1 | 6.6 | 458 | 92 |
| Example 24 | LE-24 | 4.4 | 6.2 | 457 | 45 |
| Example 25 | LE-25 | 4.3 | 6.1 | 458 | 78 |
| Example 26 | LE-26 | 4.1 | 6.2 | 458 | 64 |
| Example 27 | LE-27 | 4.2 | 6.0 | 458 | 75 |
| Example 28 | LE-28 | 4.7 | 6.4 | 457 | 85 |
| Example 29 | LE-29 | 4.3 | 6.0 | 458 | 62 |
| Example 30 | LE-30 | 4.5 | 6.3 | 458 | 60 |
| Example 31 | LE-31 | 4.6 | 6.2 | 458 | 55 |
| Example 32 | LE-32 | 4.5 | 6.4 | 457 | 59 |
| Example 33 | LE-33 | 4.4 | 6.3 | 458 | 81 |
| Example 34 | LE-34 | 4.5 | 6.3 | 458 | 70 |
| Example 35 | LE-35 | 4.5 | 6.3 | 458 | 83 |
| Example 36 | LE-36 | 4.5 | 6.2 | 457 | 92 |
| Comparative Example 1 | — | 4.7 | 5.6 | 458 | 32 |
| Comparative Example 2 | BCP | 5.3 | 5.9 | 458 | 28 |

The lifetime was measured by measuring the time when the light emitting luminance became 97% through a lifetime tester.

From the observation of Table 3, it could be confirmed that the organic electroluminescent devices in Examples 1 to 12, which include the lifetime enhancement layer of the present disclosure, are better than the organic electroluminescent devices in Comparative Examples 1 and 2 in terms of current efficiency, driving voltage, and lifetime.

[Examples 37 to 51] Manufacture of Green Phosphorescent Organic Electroluminescent Device A glass substrate thinly coated with indium tin oxide (ITO) to have a thickness of 1,500 Å was ultrasonically washed with distilled water. When the washing with distilled water was completed, the substrate was ultrasonically washed with a solvent such as isopropyl alcohol, acetone, and methanol, dried, transferred to a UV ozone cleaner (Power sonic 405, manufactured by Hwashin Tech), cleaned for 5 minutes by using UV, and then transferred to a vacuum evaporator.

A device was manufactured by sequentially depositing a hole injection layer, a hole transporting layer, a light emitting layer, a lifetime enhancement layer, an electron transporting layer, an electron injection layer, and a cathode in this order on the ITO transparent electrode (substrate) prepared as described above. The structure of the manufactured device is shown in the following Table 4.

TABLE 4

| | Compound | Thickness |
|---|---|---|
| Hole injection layer | m-MTDATA | 60 nm |
| Hole transporting layer | TCTA | 80 nm |
| Light emitting layer | CBP + 10% $Ir(ppy)_3$ | 30 nm |
| Lifetime enhancement layer | See the following Table 5 | 5 nm |
| Electron transporting layer | $Alq_3$ | 25 nm |
| Electron injection layer | LiF | 1 nm |
| Cathode | Al | 200 nm |

The structures of m-MTDATA, TCTA, $Ir(ppy)_3$, and CBP used in Table 4 are as follows:

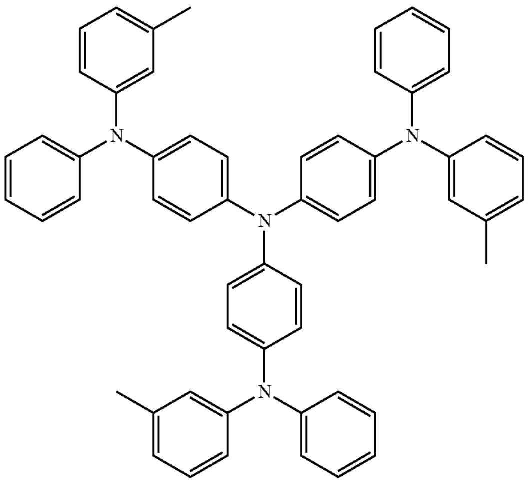

m-MTDATA

-continued

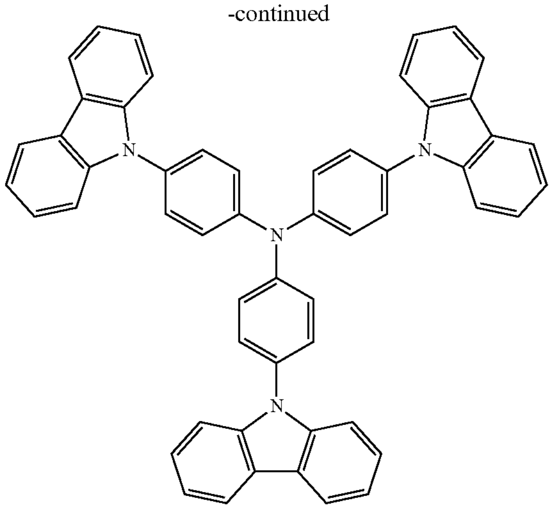

TCTA

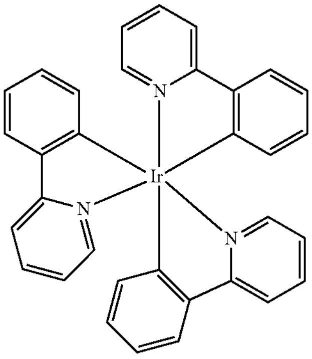

$Ir(ppy)_3$

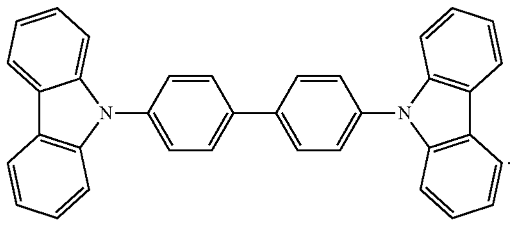

CBP

[Comparative Example 3] Manufacture of Green Phosphorescent Organic Electroluminescent Device A device was manufactured in the same manner as in Example 37, except that the electron transporting layer was deposited to have a thickness of 30 nm without using the lifetime enhancement layer.

[Comparative Example 4] Manufacture of Green Phosphorescent Organic Electroluminescent Device A device was manufactured in the same manner as in Example 37, except that BCP used in Comparative Example 2 was used instead of LE-02.

Experimental Example 2

For each of the devices manufactured in Examples 37 to 51 and Comparative Examples 3 and 4, the driving voltage, the current efficiency, the light emitting wavelength, and the lifetime ($T_{97}$) at a current density of 10 mA/$cm^2$ were measured, and the results are shown in the following Table 5.

TABLE 5

| | Compound | Driving voltage (V) | Current efficiency (cd/A) | Light emitting peak (nm) | Lifetime (hr, $T_{97}$) |
|---|---|---|---|---|---|
| Example 37 | LE-02 | 7.3 | 37.0 | 516 | 49 |
| Example 38 | LE-07 | 7.2 | 36.9 | 516 | 65 |
| Example 39 | LE-08 | 7.4 | 37.0 | 517 | 85 |
| Example 40 | LE-09 | 7.1 | 37.8 | 516 | 55 |
| Example 41 | LE-10 | 7.0 | 35.3 | 515 | 54 |
| Example 42 | LE-11 | 7.4 | 36.9 | 516 | 98 |
| Example 43 | LE-12 | 7.3 | 37.1 | 516 | 103 |
| Example 44 | LE-17 | 7.3 | 37.0 | 516 | 51 |
| Example 45 | LE-18 | 7.1 | 38.2 | 516 | 49 |
| Example 46 | LE-19 | 7.2 | 36.9 | 516 | 68 |
| Example 47 | LE-22 | 7.4 | 37.0 | 517 | 59 |
| Example 48 | LE-23 | 7.1 | 40.1 | 516 | 95 |
| Example 49 | LE-25 | 7.0 | 35.3 | 515 | 66 |
| Example 50 | LE-26 | 7.4 | 36.9 | 516 | 74 |
| Example 51 | LE-28 | 6.8 | 39.8 | 516 | 103 |
| Comparative Example 3 | — | 7.2 | 36.8 | 516 | 45 |
| Comparative Example 4 | BCP | 7.9 | 40.2 | 516 | 40 |

The lifetime was measured by measuring the time when the light emitting luminance became 97% through a lifetime tester.

From the observation of Table 5, it could be confirmed that the organic electroluminescent devices in Examples 37 to 51, which include the lifetime enhancement layer of the present disclosure, are better than the organic electroluminescent devices in Comparative Examples 3 and 4 in terms of current efficiency, driving voltage, and lifetime.

INDUSTRIAL APPLICABILITY

The present disclosure may provide an organic electroluminescent device having excellent driving voltage, light emitting efficiency, and lifetime by introducing a lifetime enhancement layer, an electron transporting layer, or an electron injection layer, which is composed of a bipolar compound having specific physical properties, into the organic electroluminescent device. Further, a display panel with improved performance and lifetime may be provided by applying the organic electroluminescent device of the present application to a display panel.

The invention claimed is:

1. An organic electroluminescent device comprising:

an anode;

a cathode; and one or more organic material layers interposed between the anode and the cathode, wherein said one or more organic material layers comprise (a) a light emitting layer comprising a host material and a dopant material, (b) a lifetime enhancement layer comprising a bipolar compound, (c) an electron transporting layer, and (d) at least one layer selected from the group consisting of a hole injection layer, a hole transporting layer, and an electron injection layer, the lifetime enhancement layer is interposed between the light emitting layer and the electron transporting layer, the lifetime enhancement layer comprises a bipolar compound having both an electron withdrawal group (EWG) moiety and an electron donor group (EDG) moiety, the EWG moiety in the bipolar compound comprises one or more moieties selected from the group consisting of the following chemical formulae:

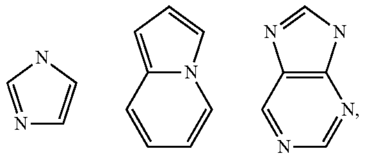

the bipolar compound satisfies the following (a) to (d) conditions:

(a) an ionization potential [Ip(LEL)] is 5.5 eV or more, (b) $E_{HOMO}-E_{LUMO}>2.9$ eV, (c) triplet energy is 2.3 eV or more, and (d) $\Delta Est<0.5$ eV ($\Delta Est$ indicates a difference between singlet energy and triplet energy of the compound).

2. The organic electroluminescent device of claim 1, wherein the light emitting layer is a blue fluorescence, a green fluorescence, or a red phosphorescence.

3. The organic electroluminescent device of claim 1, wherein when the light emitting layer is a green phosphorescence, the bipolar compound comprised in the lifetime enhancement layer has triplet energy of 2.3 eV or more and an ionization potential of 6.0 eV or more.

4. The organic electroluminescent device of claim 1, wherein when the light emitting layer is a blue phosphorescence, the bipolar compound comprised in the lifetime enhancement layer has triplet energy of 2.7 eV or more and an ionization potential of 6.0 eV or more.

5. The organic electroluminescent device of claim 1, wherein the bipolar compound comprises any one of electron donor group (EDG) moieties represented by the following Chemical Formula 1g:

[Chemical Formula 1g]

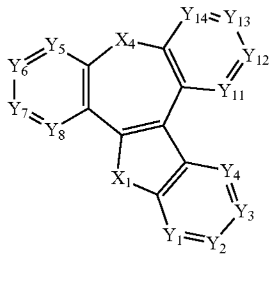

in Chemical Formula 1g, $X_1$ is selected from the group consisting of O, S, Se, $N(Ar_1)$, $C(Ar_2)(Ar_3)$, and $Si(Ar_4)(Ar_5)$, $Y_1$ to $Y_4$ are the same as or different from each other, and are each independently N or $C(R_1)$, $Y_5$ to $Y_8$ and $Y_{11}$ to $Y_{14}$ are the same as or different from each other, and are each independently N or $C(R_3)$, and in this case, a plurality of $R_3$'s are the same as or different from each other, $X_4$ is the same as $X_1$, and in this case, a plurality of $Ar_1$'s to $Ar_5$'s are the same as or different from each other, a plurality of $R_3$'s, which do not form a fused ring, $R_1$ and $Ar_1$ to $Ar_5$ are the same as or different from each other, and are each independently selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkyl boron group, the aryl boron group, the phosphine group, the phosphine oxide group, and the arylamine group of $R_3$ are each independently unsubstituted or substituted with one or more selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkyl boron group, a $C_6$ to $C_{60}$ aryl boron group, a $C_1$ to $C_{40}$ phosphine group, a $C_1$ to $C_{40}$ phosphine oxide group, and a $C_6$ to $C_{60}$ arylamine group.

6. The organic electroluminescent device of claim 1, wherein a material for the electron transporting layer is the same as a material for the lifetime enhancement layer.

7. The organic electroluminescent device of claim 1, wherein a material for the electron injection layer is the same as a material for the lifetime enhancement layer.

8. The organic electroluminescent device of claim 1, wherein the electron injection layer or the electron transporting layer is provided by co-depositing alkali metal complexes.

9. The organic electroluminescent device of claim 1, wherein an organic film layer blocking electrons and excitons is further provided between the hole transporting layer and the light emitting layer.

10. The organic electroluminescent device of claim 1, wherein the light emitting layer comprises a host material and a dopant material, and comprises the dopant in a range of 0.1 wt % to 30 wt %.

11. The organic electroluminescent device of claim 1, wherein a plurality of light emitting layers is sequentially laminated between the hole transporting layer and the electron transporting layer to implement a mixed color when voltage or current is applied thereto.

12. The organic electroluminescent device of claim 1, wherein between the hole transporting layer and the electron transporting layer, a plurality of light emitting layers composed of homogeneous material is laminated, or a plurality of light emitting layers composed of heterogeneous materials is provided in series to implement a mixed color when voltage or current is applied thereto.

* * * * *